US012660179B2

(12) United States Patent (10) Patent No.: US 12,660,179 B2

Wada et al. (45) Date of Patent: Jun. 16, 2026

(54) SEMICONDUCTOR DEVICE WITH IMPROVED DICING REGION FOR REDUCED PEELING DEFECTS

(71) Applicant: Kioxia Corporation, Tokyo (JP)

(72) Inventors: Hideo Wada, Yokkaichi (JP); Hiroyuki Yamasaki, Nagoya (JP); Masahisa Sonoda, Yokkaichi (JP); Go Oike, Kuwana (JP)

(73) Assignee: KIOXIA CORPORATION, Tokyo (JP)

( * ) Notice: Subject to any disclaimer, the term of this patent is extended or adjusted under 35 U.S.C. 154(b) by 665 days.

(21) Appl. No.: 17/686,108

(22) Filed: Mar. 3, 2022

(65) Prior Publication Data

US 2023/0082971 A1 Mar. 16, 2023

(30) Foreign Application Priority Data

Sep. 10, 2021 (JP) ................................. 2021-148093
Feb. 2, 2022 (JP) ................................. 2022-015204

(51) Int. Cl.

| *H10B 43/27* | (2023.01) |
| *H10B 41/10* | (2023.01) |
| *H10B 41/27* | (2023.01) |
| *H10B 43/10* | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 41/00–70; H10B 43/00–50; H01L 24/00–70
See application file for complete search history.

(56) References Cited

U.S. PATENT DOCUMENTS

| 9,558,945 | B2 | 1/2017 | Fukuzumi et al. | |
| 2016/0079164 | A1 | 3/2016 | Fukuzumi et al. | |
| 2020/0219842 | A1* | 7/2020 | Ji | ............................. H01L 24/96 |
| 2020/0303408 | A1* | 9/2020 | Yoshimizu | ........ H01L 21/02532 |
| 2021/0057376 | A1 | 2/2021 | Nakanishi et al. | |
| 2021/0074638 | A1 | 3/2021 | Sanuki et al. | |
| 2021/0082877 | A1* | 3/2021 | Uchiyama | ............... H01L 25/50 |
| 2021/0265293 | A1 | 8/2021 | Tagami | |

FOREIGN PATENT DOCUMENTS

| TW | 202036859 | A | 10/2020 |
| TW | 202111868 | A | 3/2021 |
| TW | 202114071 | A | 4/2021 |
| TW | 202114107 | A | 4/2021 |
| TW | 202133369 | A | 9/2021 |

* cited by examiner

*Primary Examiner* — Christine S. Kim
*Assistant Examiner* — Tyler J Wiegand
(74) *Attorney, Agent, or Firm* — Foley & Lardner LLP

(57) ABSTRACT

A semiconductor device includes a first substrate, a first insulating film disposed on the first substrate, and a semiconductor layer disposed on the first insulating film. The semiconductor device further includes a metal layer with a first portion and a second portion. The first portion is disposed on the semiconductor layer, and the second portion includes a bonding pad and is disposed on the first insulating film without the semiconductor layer interposed between the second portion and the first insulating film.

19 Claims, 39 Drawing Sheets

SEMICONDUCTOR DEVICE WITH IMPROVED DICING REGION FOR REDUCED PEELING DEFECTS

CROSS-REFERENCE TO RELATED APPLICATION(S)

This application is based upon and claims the benefit of priority from Japanese Patent Application No. 2021-148093, filed Sep. 10, 2021 and Japanese Patent Application No. 2022-015204, filed Feb. 2, 2022, the entire contents of which are incorporated herein by reference.

FIELD

Embodiments described herein relate generally to a semiconductor device and a method for manufacturing the same.

BACKGROUND

An unwanted semiconductor layer remaining in a semiconductor device may decrease the performance of the semiconductor device, or may interfere with manufacturing of the semiconductor device.

DESCRIPTION OF THE DRAWINGS

FIG. 5 is a cross-sectional view illustrating a structure of a semiconductor device of Comparative Example of the first embodiment.

FIG. 9 is a cross-sectional view illustrating the semiconductor device of the first embodiment, during one of various fabrication stages of an example method (3/6).

FIG. 11 is a cross-sectional view illustrating the semiconductor device of the first embodiment, during one of various fabrication stages of an example method (5/6).

FIG. 17 is a plan view illustrating a semiconductor device of a second embodiment, during one of various fabrication stages of an example method.

FIG. 35 is a cross-sectional view illustrating a structure of a semiconductor device of a third embodiment.

FIG. 36 is a cross-sectional view illustrating a structure of a semiconductor device of Comparative Example of the third embodiment.

FIG. 38 is a plan view illustrating a structure of a semiconductor device of Modified Example of the third embodiment.

DETAILED DESCRIPTION

Embodiments provide a semiconductor device capable of reducing a problem caused by a semiconductor layer, and a method for manufacturing the same.

In general, according to one embodiment, a semiconductor device includes a first substrate, a first insulating film disposed on the first substrate, and a semiconductor layer disposed on the first insulating film. The semiconductor device further includes a metal layer including a first portion and a second portion. The first portion is disposed on the semiconductor layer, and the second portion includes a bonding pad and is disposed on the first insulating film without the semiconductor layer interposed between the second portion and the first insulating film.

Hereinafter, embodiments will be described with reference to the drawings. In FIGS. 1 to 39, the same elements are denoted with the same reference symbols, and duplicated description is omitted.

First Embodiment

Figure 1:
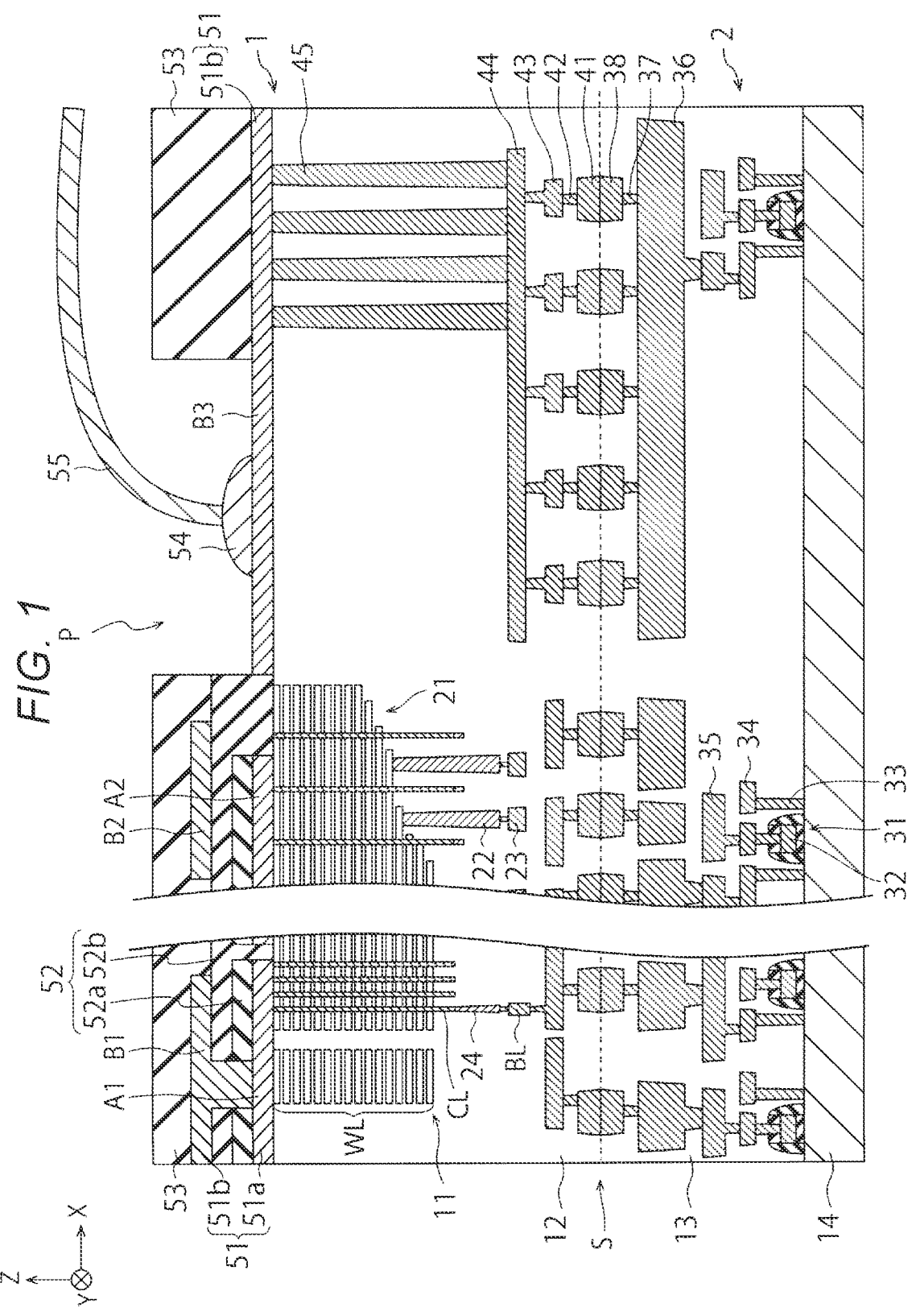
FIG. 1 is a cross-sectional view illustrating a structure of a semiconductor device of a first embodiment.

FIG. 1 is a cross-sectional view illustrating a structure of a semiconductor device of a first embodiment. The semiconductor device of FIG. 1 is a three-dimensional memory in which an array chip 1 is bonded to a circuit chip 2.

The array chip 1 includes a memory cell array 11 including a plurality of memory cells, and an interlayer insulating film 12 disposed under the memory cell array 11. For example, the interlayer insulating film 12 is a silicon oxide film ($SiO_2$ film) or a stacked film including a $SiO_2$ film and another insulating film. The interlayer insulating film 12 is an example of a first or fourth insulating film.

The circuit chip 2 is disposed under the array chip 1. A reference symbol S refers to a bonding surface between the array chip 1 and the circuit chip 2. The circuit chip 2 includes an interlayer insulating film 13 and a substrate 14 disposed under the interlayer insulating film 13. For example, the interlayer insulating film 13 is a $SiO_2$ film or a stacked film including a $SiO_2$ film and another insulating film. The interlayer insulating film 13 is an example of the first insulating film or a third insulating film. For example, the substrate 14 is a semiconductor substrate such as a silicon (Si) substrate. The substrate 14 is an example of a first substrate.

FIG. 1 illustrates X and Y directions that are parallel to a front surface of the substrate 14 and are perpendicular to each other, and a Z direction perpendicular to the front surface of the substrate 14. Herein, a +Z direction is used as an upward direction, and a −Z direction is used as a downward direction. The −Z direction may or may not correspond to the direction of gravity.

The array chip 1 includes, as a plurality of electrodes in the memory cell array 11, a plurality of word lines WL spaced from each other. FIG. 1 illustrates a stair structure 21 of the memory cell array 11. Each of the word lines WL is electrically connected to a word line layer 23 via a contact plug 22. Each columnar portion CL penetrating a plurality of the word lines WL is electrically connected to a bit line BL via a via plug 24, and is electrically connected to a source layer 51 (source line) described below. The word lines WL are an example of a first electrode layer, and the source layer 51 is an example of a second electrode layer.

The circuit chip 2 includes a plurality of transistors 31. Each of the transistors 31 includes a gate electrode 32 disposed on the substrate 14 via a gate insulating film, and a source diffusion layer and a drain diffusion layer that are disposed in the substrate 14 and are not illustrated. The circuit chip 2 includes a plurality of contact plugs 33 disposed on the gate electrodes 32 of the transistors 31, the source diffusion layer or the drain diffusion layer, a wiring layer 34 disposed on each of the contact plugs 33 and including a plurality of wirings, and a wiring layer 35 disposed on each of the respective wiring layers 34 and including a plurality of wirings.

The circuit chip 2 further includes a wiring layer 36 disposed on the wiring layers 35 and including a plurality of wirings, a plurality of via plugs 37 disposed on the wiring layer 36, and a plurality of metal pads 38 disposed on the via plugs 37. For example, the metal pads 38 are metal layers each including a copper (Cu) layer. The metal pads 38 are an example of a first pad. The circuit chip 2 functions as a control circuit (logical circuit) for controlling an operation of the array chip 1. This control circuit is configured with the transistors 31 and the like, and is electrically connected to the metal pads 38.

The array chip 1 includes a plurality of metal pads 41 disposed on the metal pads 38, and a plurality of via plugs 42 disposed on the metal pads 41. The array chip 1 includes a wiring layer 43 disposed on each of the via plugs 42 and including a plurality of wirings, a wiring layer 44 disposed on the wiring layers 43 and including a plurality of wirings, and a plurality of via plugs 45 disposed on the wiring layer 44. For example, the metal pads 41 are metal layers each including a Cu layer. The metal pads 41 are an example of a second pad. The aforementioned bit lines BL are contained in the wiring layer 44. The aforementioned control circuit is electrically connected to the memory cell array 11 via the metal pads 41 and 38 and the like, and controls an operation of the memory cell array 11 via the metal pads 41 and 38 and the like.

The array chip 1 further includes a semiconductor layer 51a, a metal layer 51b, an insulating film 52a, an insulating film 52b, a passivation insulating film 53, a solder layer 54, and a bonding wire 55. FIG. 1 further illustrates the source layer 51 including a part of the semiconductor layer 51a and a part of the metal layer 51b, and an insulating film 52 including the insulating film 52a and the insulating film 52b. The insulating film 52 is an example of a second insulating film.

The semiconductor layer 51a is formed on the memory cell array 11 and the interlayer insulating film 12 above the substrate 14. The semiconductor layer 51a is disposed on the columnar portions CL, and is electrically connected to the columnar portions CL. For example, the semiconductor layer 51a is a polysilicon layer. The semiconductor layer 51a of the embodiment contains portions A1 and A2 separated from each other.

The insulating film 52a is formed on the semiconductor layer 51a. For example, the insulating film 52a is a $SiO_2$ film.

The insulating film 52b is formed on the insulating film 52a. For example, the insulating film 52b is a $SiO_2$ film. The insulating film 52b of the embodiment is formed on an upper surface and a side surface of the insulating film 52a, and a side surface of the semiconductor layer 51a.

The metal layer 51b is formed on the interlayer insulating film 12, a plurality of the via plugs 45, the semiconductor layer 51a, and the insulating film 52b. For example, the metal layer 51b includes an aluminum (Al) layer. The metal layer 51b of the embodiment contains portions B1, B2, and B3 separated from one another. The portion B1 is an example of a first portion, and the portion B3 is an example of a second portion.

The portion B1 is formed on the portion A1, and is electrically connected to the portion A1. The source layer 51 of the embodiment includes a part of the semiconductor layer 51a and a part of the metal layer 51b as described above, and more specifically contains the portions A1 and B1.

The portion B2 is formed on the insulating film 52b. The portion B2 of the embodiment is electrically insulated against the portion B1. For example, the portion B2 is used as a power supply line.

The portion B3 is formed on the interlayer insulating film 12 and a plurality of the via plugs 45, and is electrically connected to the via plugs 45. The portion B3 illustrated in FIG. 1 is electrically connected to a predetermined one of the transistors 31 via the via plugs 45, the metal pads 41 and 38, and the like. The portion B3 of the embodiment is formed on the interlayer insulating film 12 and the via plugs 45 without the semiconductor layer 51a, and the insulating films 52a and 52b interposed between the portion B3 and the interlayer insulating film 12 and the via plugs 45, that is, the portion B3 is in contact with the interlayer insulating film 12 and the via plugs 45. The portion B3 of the embodiment is electrically insulated against the portions B1 and B2.

The insulating passivation film 53 is formed on the metal layer 51b and the insulating film 52b, and covers a part of the metal layer 51b. The insulating passivation film 53 of the embodiment has an opening P in which a part of an upper surface of the portion B3 is exposed. A region of the portion B3 that is exposed in the opening P functions as an external connection pad (bonding pad) of the semiconductor device of FIG. 1. The portion B3 can be connected to a mounting substrate or another device via the bonding wire, a solder ball, a metal bump, or the like in the opening P. FIG. 1 illustrates the bonding wire 55 electrically connected to the portion B3 via the solder layer 54. For example, the insulating passivation film 53 is a stacked film including a $SiO_2$ film and another insulating film.

Figure 2:
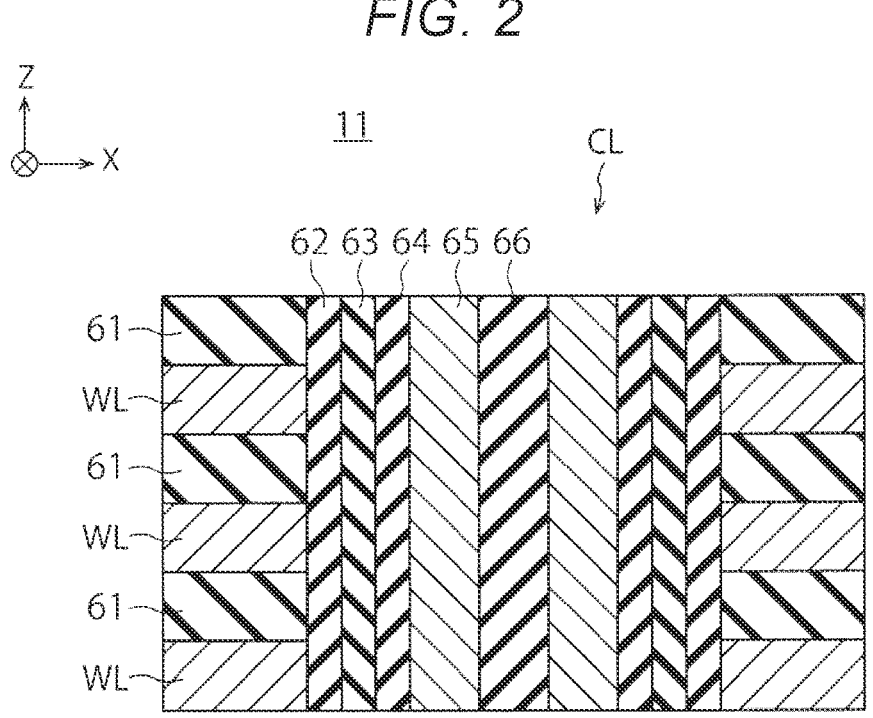
FIG. 2 is a cross-sectional view illustrating a structure of a columnar portion of the first embodiment.

FIG. 2 is a cross-sectional view illustrating a structure of the columnar portions CL of the first embodiment.

As illustrated in FIG. 2, the memory cell array 11 includes a plurality of the word lines WL and a plurality of insulating layers 61 alternately stacked on the interlayer insulating film 12 (FIG. 1). For example, the word lines WL are metal layers each including a tungsten (W) layer. For example, the insulating layers 61 are $SiO_2$ films.

Each of the columnar portions CL includes a block insulating film 62, a charge storage layer 63, a tunnel insulating film 64, a channel semiconductor layer 65, and a core insulating film 66 in order. For example, the charge storage layer 63 is a silicon nitride film (SiN film). The charge storage layer 63 is formed on side surfaces of the word lines WL and the insulating layers 61 via the block insulating film 62. The charge storage layer 63 may be a semiconductor layer such as a polysilicon layer. For example, the channel semiconductor layer 65 is a polysilicon layer. The channel semiconductor layer 65 is formed on a side surface of the charge storage layer 63 via the tunnel insulating film 64. For example, the block insulating film 62, the tunnel insulating film 64, and the core insulating film 66 are $SiO_2$ films or metal insulating films.

Figure 3:
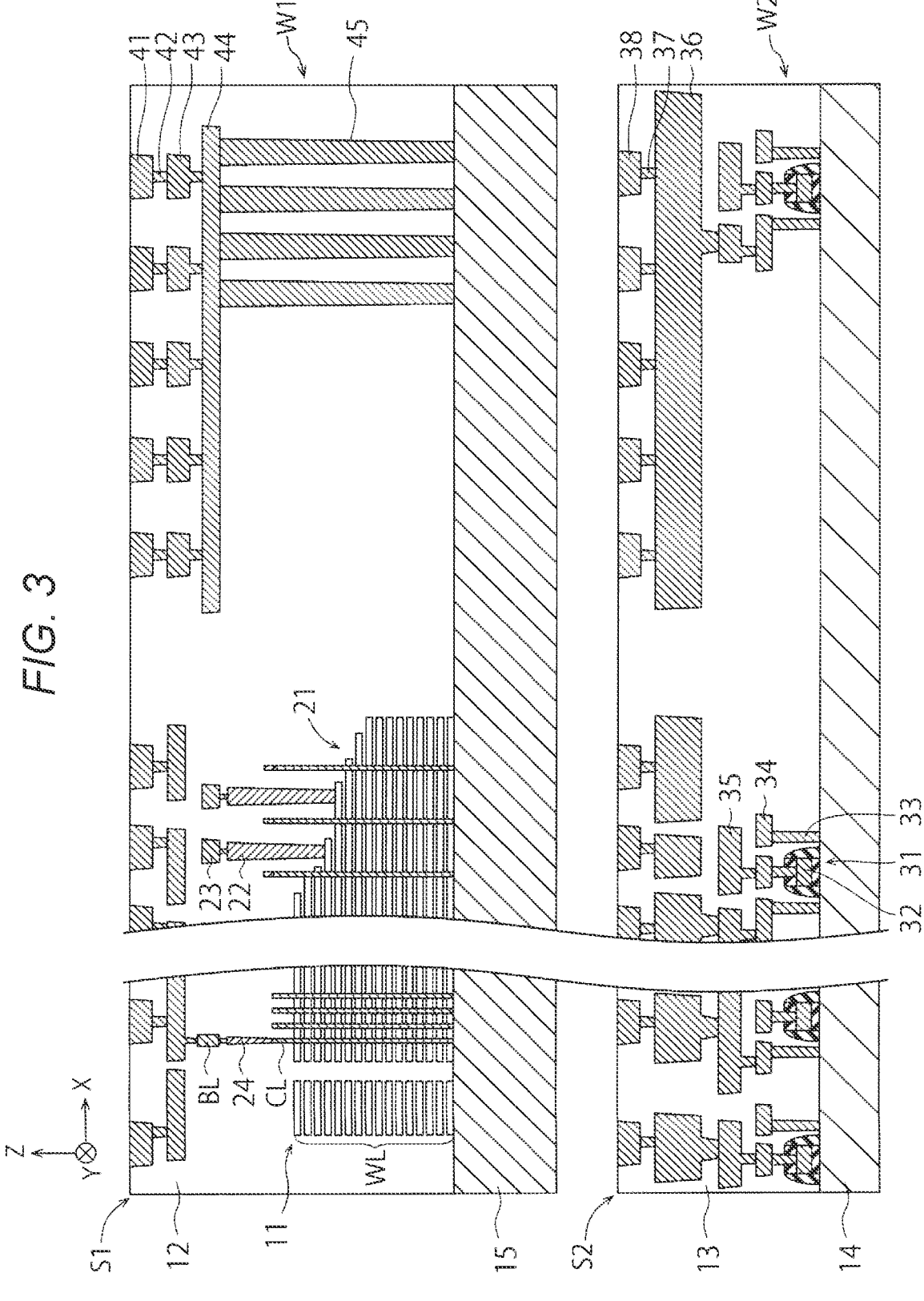
FIG. 3 is a cross-sectional view illustrating a method for manufacturing the semiconductor device of the first embodiment (1/2).
Figure 4:
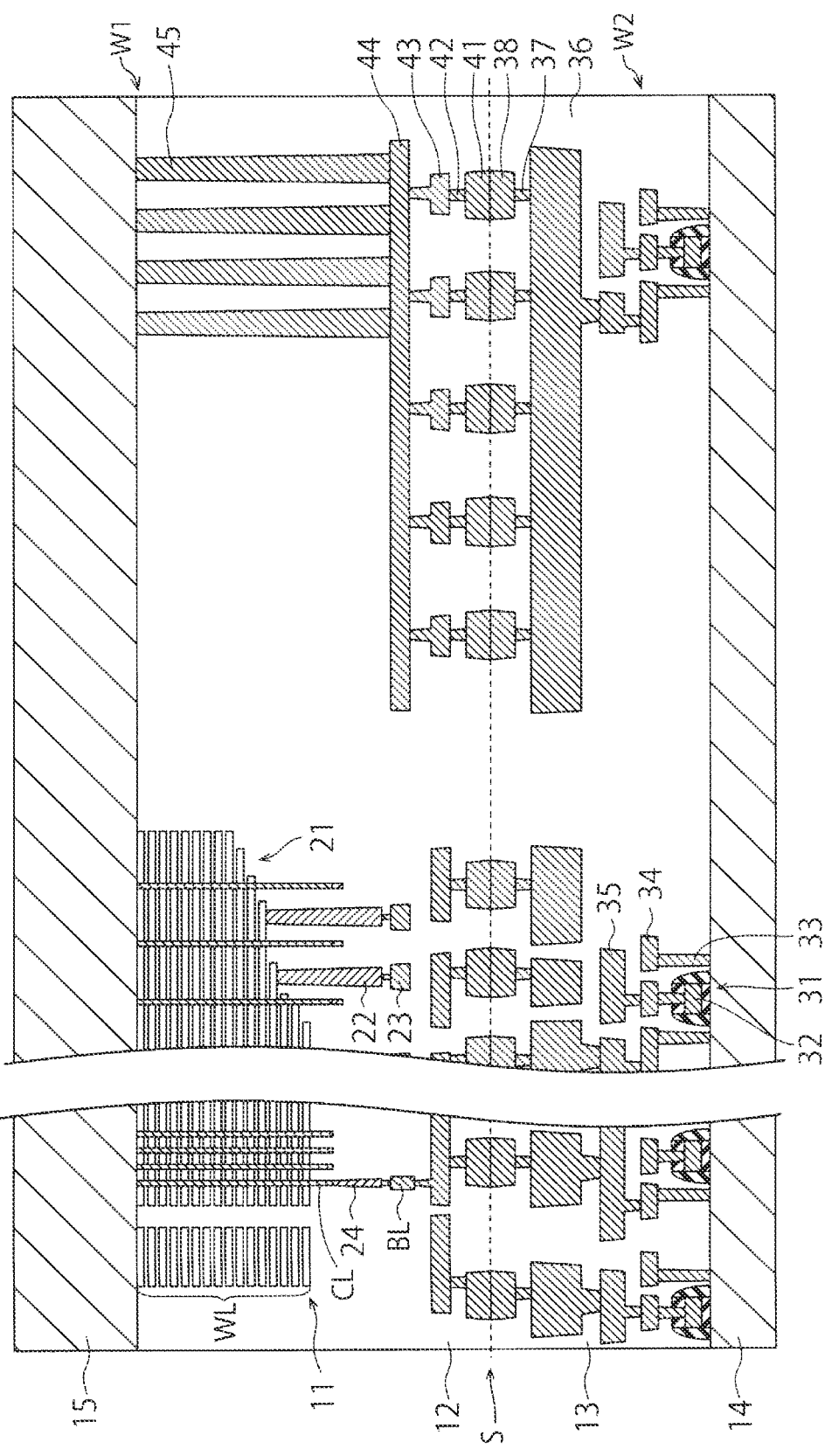
FIG. 4 is a cross-sectional view illustrating the method for manufacturing the semiconductor device of the first embodiment (2/2).

FIGS. 3 and 4 are cross-sectional views illustrating a method for manufacturing the semiconductor device of the first embodiment.

FIG. 3 illustrates an array wafer W1 including a plurality of the array chips 1 and a circuit wafer W2 including a plurality of the circuit chips 2. The array wafer W1 is also called "memory wafer", and the circuit wafer W2 is also called "CMOS wafer".

It should be noted that a direction of the array wafer W1 in FIG. 3 is opposite to a direction of the array chip 1 in FIG. 1. In this embodiment, the array wafer W1 is bonded to the circuit wafer W2 to manufacture the semiconductor device. FIG. 3 illustrates the array wafer W1 before the direction is inverted for bonding. FIG. 1 illustrates the array chip 1 after the direction is inverted for bonding and bonding and dicing are performed.

In FIG. 3, a reference symbol S1 refers to the upper surface of the array wafer W1, and a reference symbol S2 refers to the upper surface of the circuit wafer W2. It should be noted that the array wafer W1 includes a substrate 15 disposed under the memory cell array 11 and the interlayer insulating film 12. For example, the substrate 15 is a semiconductor substrate such as a silicon substrate. The substrate 15 is an example of a second substrate.

In this embodiment, the memory cell array 11, the interlayer insulating film 12, the stair structure 21, the metal pads 41, and the like are formed on the substrate 15 of the array wafer W1, and the interlayer insulating film 13, the transistors 31, the metal pads 38, and the like are formed on the substrate 14 of the circuit wafer W2, as illustrated in FIG. 3. For example, the via plugs 45, the wiring layers 44 and 43, the via plugs 42, and the metal pads 41 are formed in order on the substrate 15. The contact plugs 33, the wiring layers 34, 35, and 36, the via plugs 37, and the metal pads 38 are formed in order on the substrate 14. Subsequently, the array wafer W1 is bonded to the circuit wafer W2 under a mechanical pressure as illustrated in FIG. 4. As a result, the interlayer insulating film 12 adheres to the interlayer insulating film 13. The array wafer W1 and the circuit wafer W2 are then annealed at 400° C. As a result, the metal pads 41 are joined to the metal pads 38.

Subsequently, the substrate 14 is thinned by chemical mechanical polishing (CMP), and the substrate 15 is removed by CMP. The array wafer W1 and the circuit wafer W2 are then cut into a plurality of chips. Thus, the semiconductor device of FIG. 1 is manufactured. The semiconductor layer 51a, the metal layer 51b, the source layer 51, the insulating film 52a, the insulating film 52b, the insulating film 52, the passivation insulating film 53, the solder layer 54, and the bonding wire 55 are formed on the memory cell array 11 and the interlayer insulating film 12, for example, after the substrate 14 is thinned and the substrate 15 is removed.

In this embodiment, the array wafer W1 is bonded to the circuit wafer W2. Alternatively, the array wafer W1 may be bonded to another array wafer W1. Contents described above with reference to FIGS. 1 to 4 and contents described below with reference to FIGS. 5 to 34 are applicable to bonding of the array wafers W1.

Although FIG. 1 illustrates a boundary surface between the interlayer insulating films 12 and 13 and a boundary surface between the metal pads 41 and 38, the boundary surfaces are not typically observed after the annealing. However, positions of the boundary surfaces can be estimated, for example, by detecting tilts of side surfaces of the metal pads 41 and 38, or position displacement between the side surfaces of the metal pads 41 and 38.

The semiconductor device of the embodiment in a state of FIG. 1 after cutting into a plurality of chips may be a subject to transactions, or the semiconductor device of the embodiment in a state of FIG. 4 before cutting into a plurality of chips may be subject to transactions. FIG. 1 illustrates the semiconductor device in a chip state, and FIG. 4 illustrates the semiconductor device in a wafer state. In the embodiment, a plurality of the semiconductor devices in a chip state (FIG. 1) are manufactured from one of the semiconductor device in a wafer state (FIG. 4). The semiconductor device of the embodiment in any one state of FIGS. 7 to 16 before cutting into a plurality of chips may be a subject to transactions.

Figure 5:
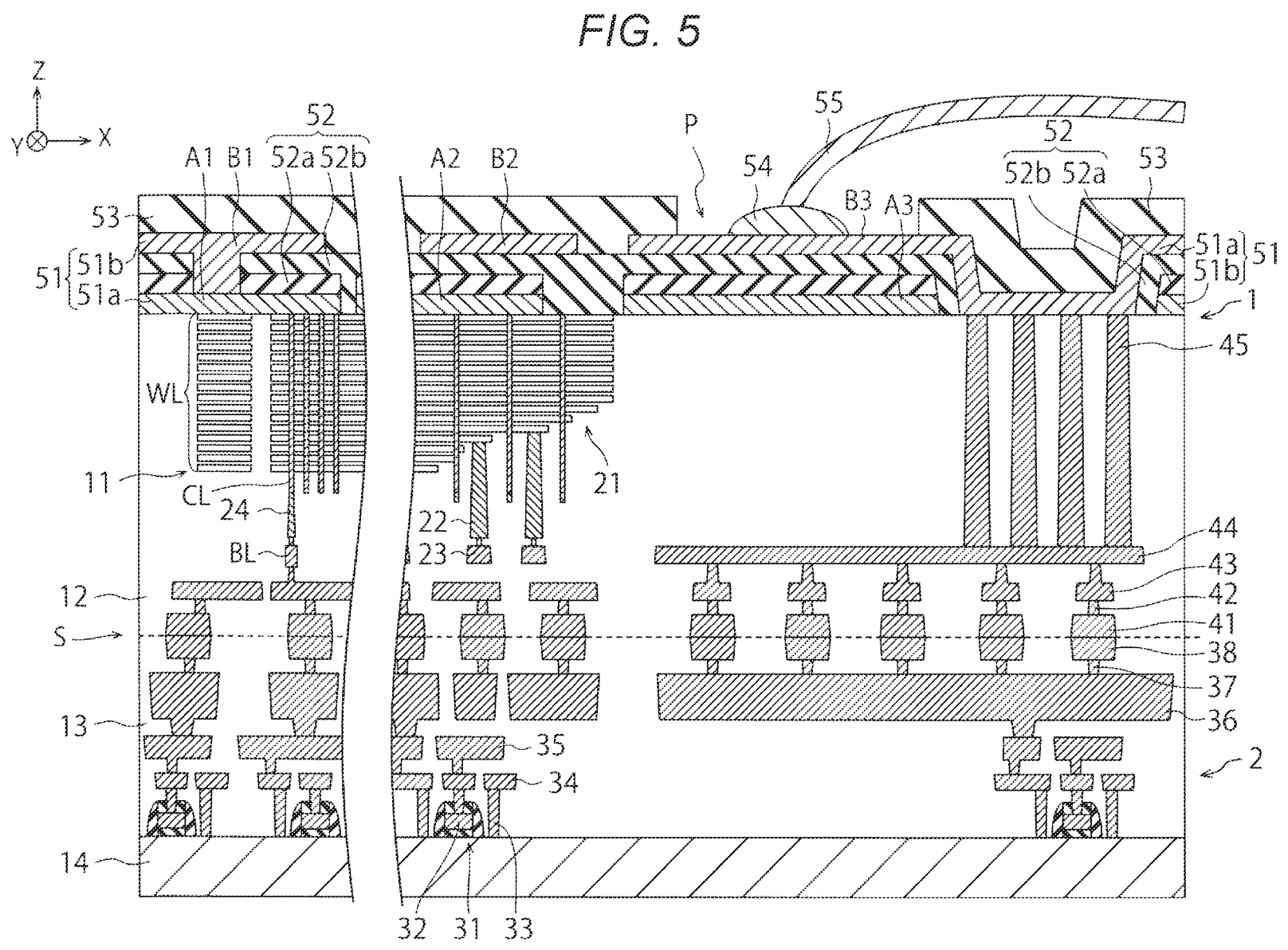

FIG. 5 is a cross-sectional view illustrating a structure of a semiconductor device of Comparative Example of the first embodiment.

The semiconductor device of Comparative Example (FIG. 5) includes the same elements as those of the semiconductor device of the first embodiment (FIG. 1). A portion B3 of Comparative Example is formed on the interlayer insulating film 12 via the semiconductor layer 51*a* (portion A3) and the insulating films 52*a* and 52*b* at a region exposed in the opening P. Specifically, a bonding pad of Comparative Example is formed on the interlayer insulating film 12 via the semiconductor layer 51*a* and the insulating films 52*a* and 52*b*. The portion A3 of the semiconductor layer 51*a* of Comparative Example is separated from the portions A1 and A2.

In Comparative Example, there are the following problems caused by the semiconductor layer 51*a* and the like.

As described above, the portion B3 of Comparative Example is formed on the interlayer insulating film 12 via the portion A3. Therefore, a parasitic capacitance is formed between the portions A3 and B3, to affect a current and a voltage passing through the portion B3 (bonding pad). For example, when this bonding pad is an input/output (I/O) pad for input/output of a signal, the transmission rate of this signal may be delayed due to the parasitic capacitance.

The portion B3 of Comparative Example has a large step between a region near the opening P and a region near the via plugs 45. This is because the portion B3 of Comparative Example is formed on the interlayer insulating film 12 and the via plugs 45 without the semiconductor layer 51*a* and the insulating films 52*a* and 52*b* interposed between the portion B3 and the interlayer insulating film 12 and the via plugs 45 at the region near the via plugs 45. This step may induce disconnection of the portion B3 or an increase in resistance.

On the other hand, the portion B3 of the embodiment is formed wholly on the interlayer insulating film 12 without the semiconductor layer 51*a* and the insulating films 52*a* and 52*b* interposed between the portion B3 and the interlayer insulating film 12 (FIG. 1). This can reduce the occurrence of the parasitic capacitance and the step as described above. Therefore, the problems caused by the parasitic capacitance and the step can be reduced.

Figure 6:
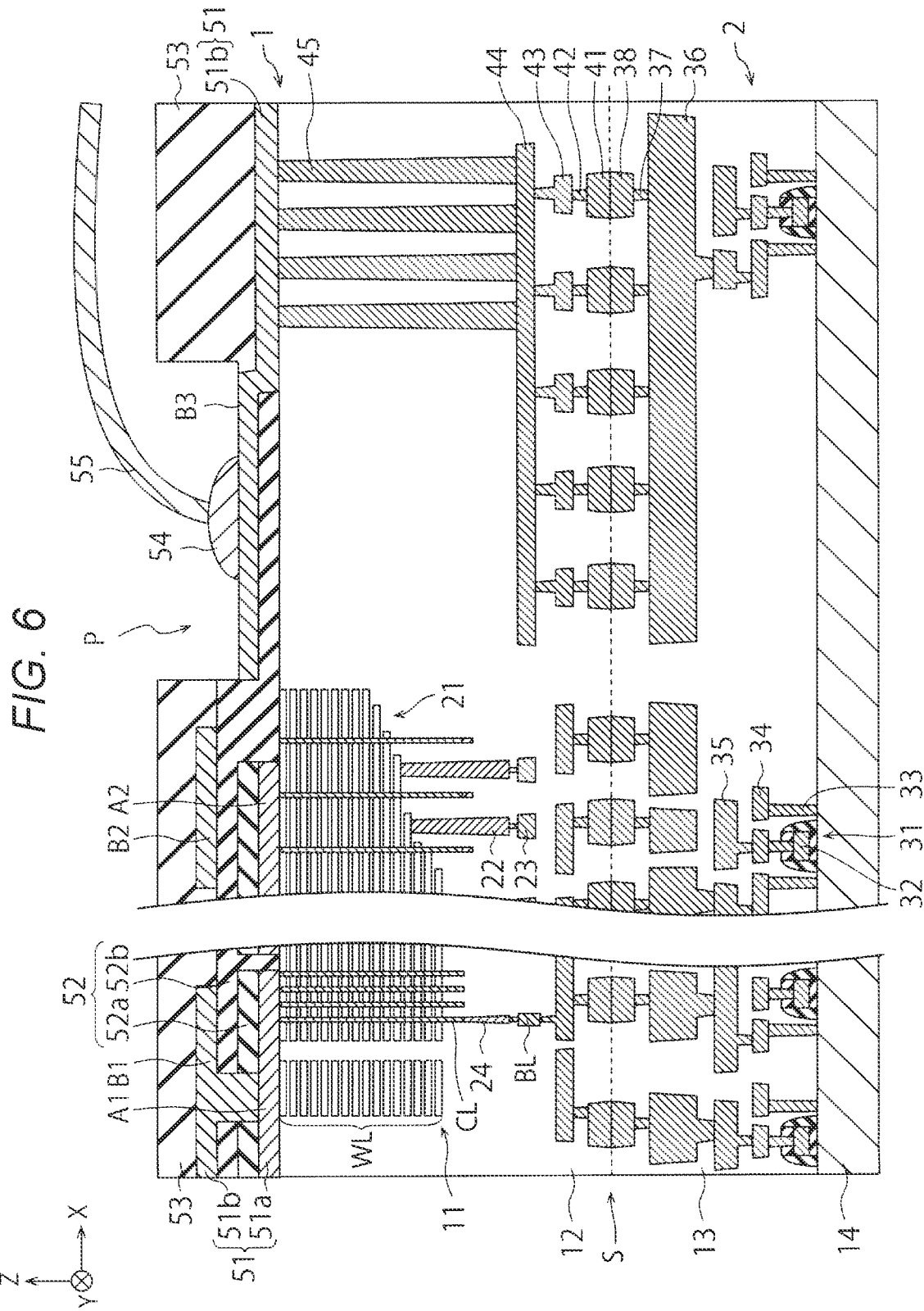
FIG. 6 is a cross-sectional view illustrating a structure of a semiconductor device of Modified Example of the first embodiment.

FIG. 6 is a cross-sectional view illustrating a structure of a semiconductor device of Modified Example of the first embodiment.

The semiconductor device of Modified Example (FIG. 6) includes the same elements as those of the semiconductor device of the first embodiment (FIG. 1). A portion B3 of Modified Example is formed on the interlayer insulating film 12 via the insulating film 52*b* without the semiconductor layer 51*a* and the insulating film 52*a* interposed between the portion B3 and the interlayer insulating film 12 at the region exposed in the opening P. That is, a bonding pad of Modified Example is formed on the interlayer insulating film 12 via the insulating film 52*b* without the semiconductor layer 51*a* and the insulating film 52*a* interposed between the bonding pad and the interlayer insulating film 12. This can reduce the occurrence of the parasitic capacitance as described above. Therefore, the problems caused by the parasitic capacitance can be reduced.

The portion B3 of Modified Example has a step between the region near the opening P and the region near the via plugs 45 like the portion B3 of Comparative Example. However, the step of Modified Example is smaller than the step of Comparative Example, and therefore the problems caused by the step can be reduced. At the portion B3 of Modified Example, the region near the opening P is an example of a third portion, and the region near the via plugs 45 is an example of a fourth portion.

FIGS. 7 to 12 are cross-sectional views illustrating the method for manufacturing the semiconductor device of the first embodiment, and specifically illustrate processes after a process illustrated in FIG. 4.

Figure 7:
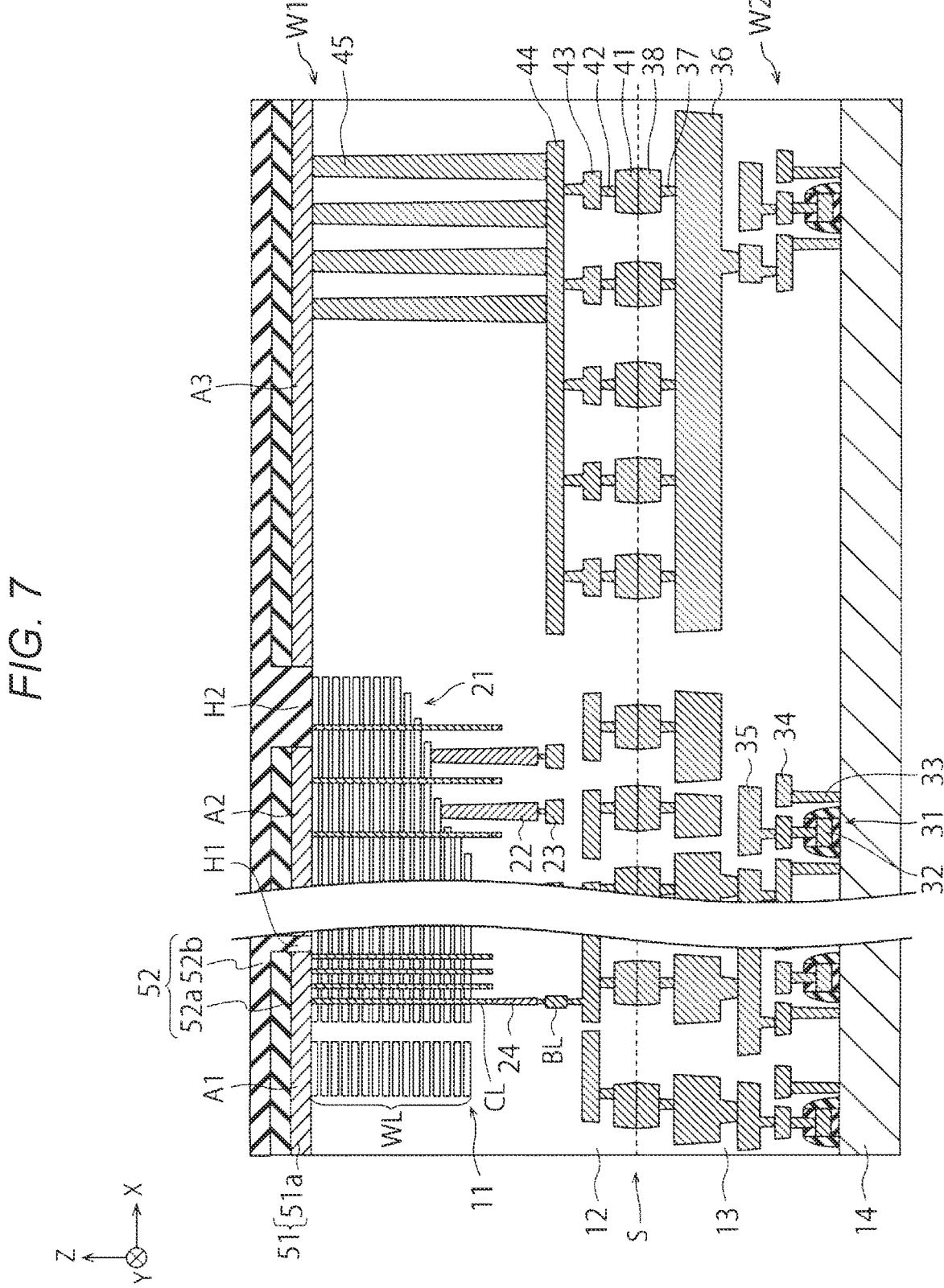
FIG. 7 is a cross-sectional view illustrating the semiconductor device of the first embodiment, during one of various fabrication stages of an example method (1/6).

In the embodiment, the substrate 15 (the array wafer W1) is bonded to the substrate 14 (the circuit wafer W2), the substrate 14 is thinned by CMP, the substrate 15 is removed by CMP, and the process illustrated in FIG. 7 is then performed.

The semiconductor layer 51*a* is first formed on the memory cell array 11, the interlayer insulating film 12, and the via plugs 45, and the insulating film 52*a* is formed on the semiconductor layer 51*a* (FIG. 7). Subsequently, openings H1 and H2 are formed in the insulating film 52*a* and the semiconductor layer 51*a* by lithography and reactive ion etching (RIE) (FIG. 7). As a result, the semiconductor layer 51*a* is separated into the portions A1 and A2. Subsequently, the insulating film 52*b* is formed on the insulating film 52*a* (FIG. 7). As a result, the openings H1 and H2 are filled with the insulating film 52*b*. FIG. 7 illustrates the insulating film 52 including the insulating films 52*a* and 52*b*.

Figure 8:
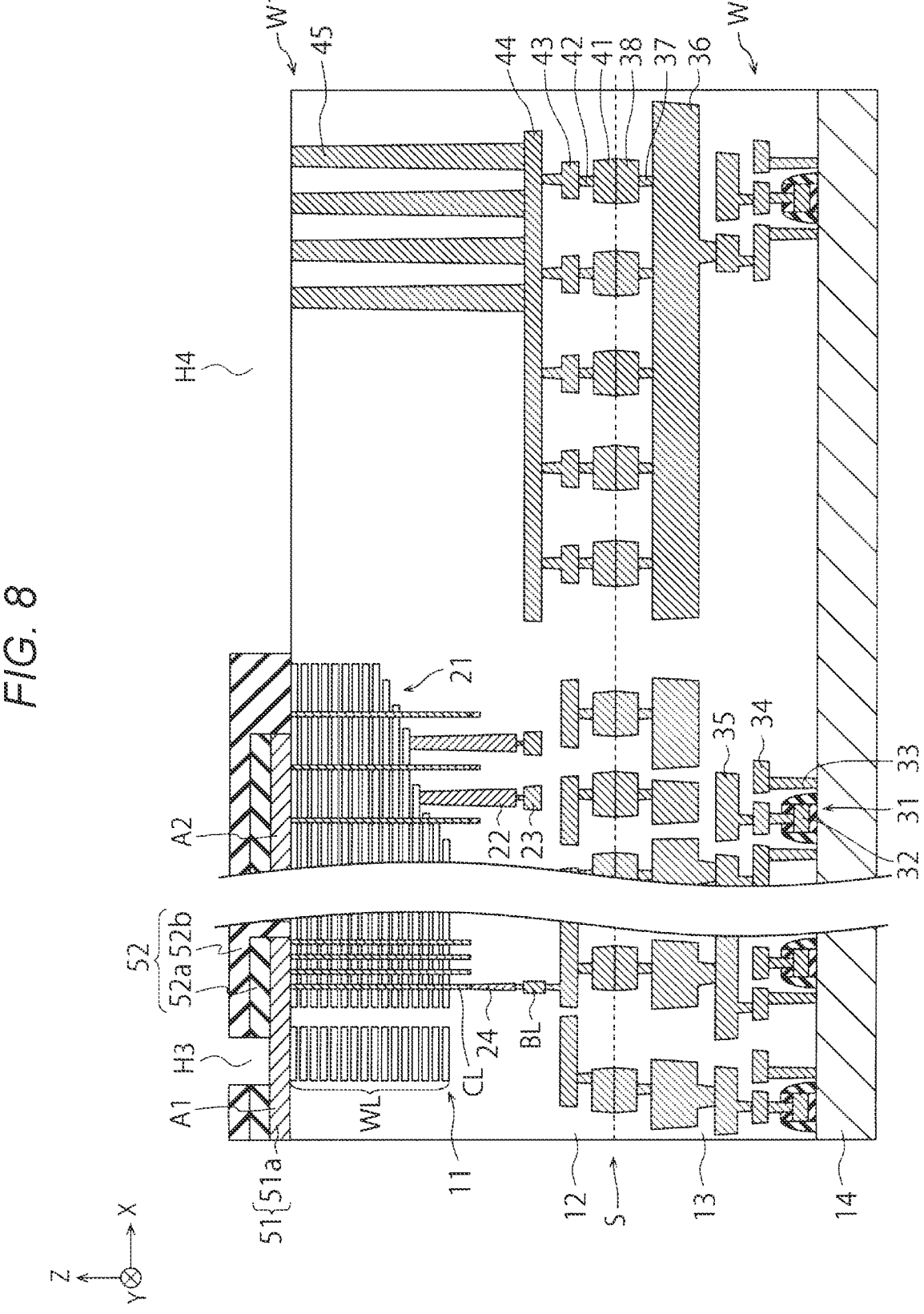
FIG. 8 is a cross-sectional view illustrating the semiconductor device of the first embodiment, during one of various fabrication stages of an example method (2/6).

Next, an opening H3 is formed in the insulating films 52*b* and 52*a*, and an opening H4 is formed in the insulating films 52*b* and 52*a* and the semiconductor layer 51*a*, by lithography and RIE (FIG. 8). As a result, the portion A1 is exposed in the opening H3, and the via plugs 45 are exposed in the opening H4.

Figure 9:
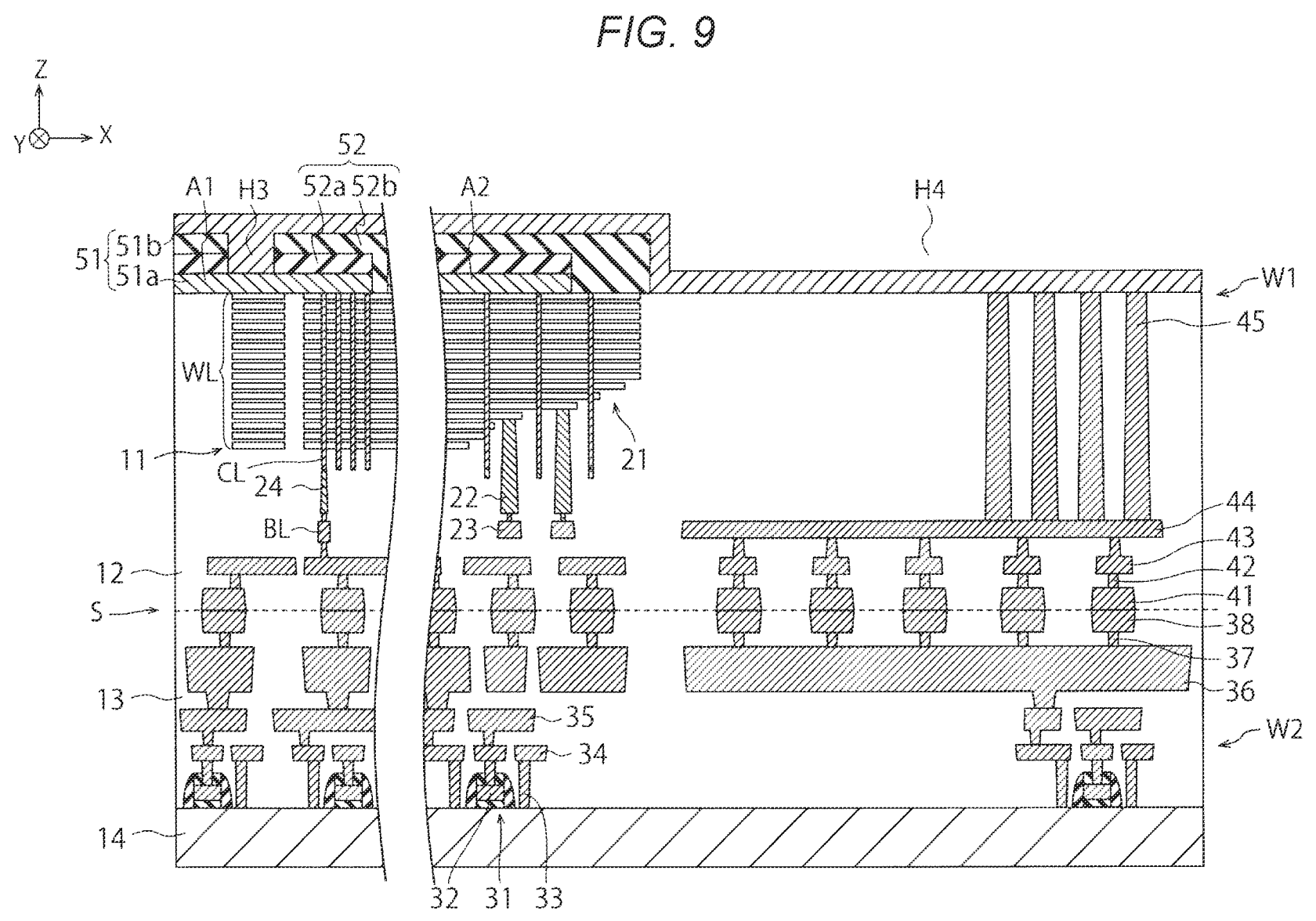

Subsequently, the metal layer 51*b* is formed on the interlayer insulating film 12, the via plugs 45, the semiconductor layer 51*a*, and the insulating film 52*b* (FIG. 9). As a result, the openings H3 and H4 are filled with the metal layer 51*b*.

Figure 10:
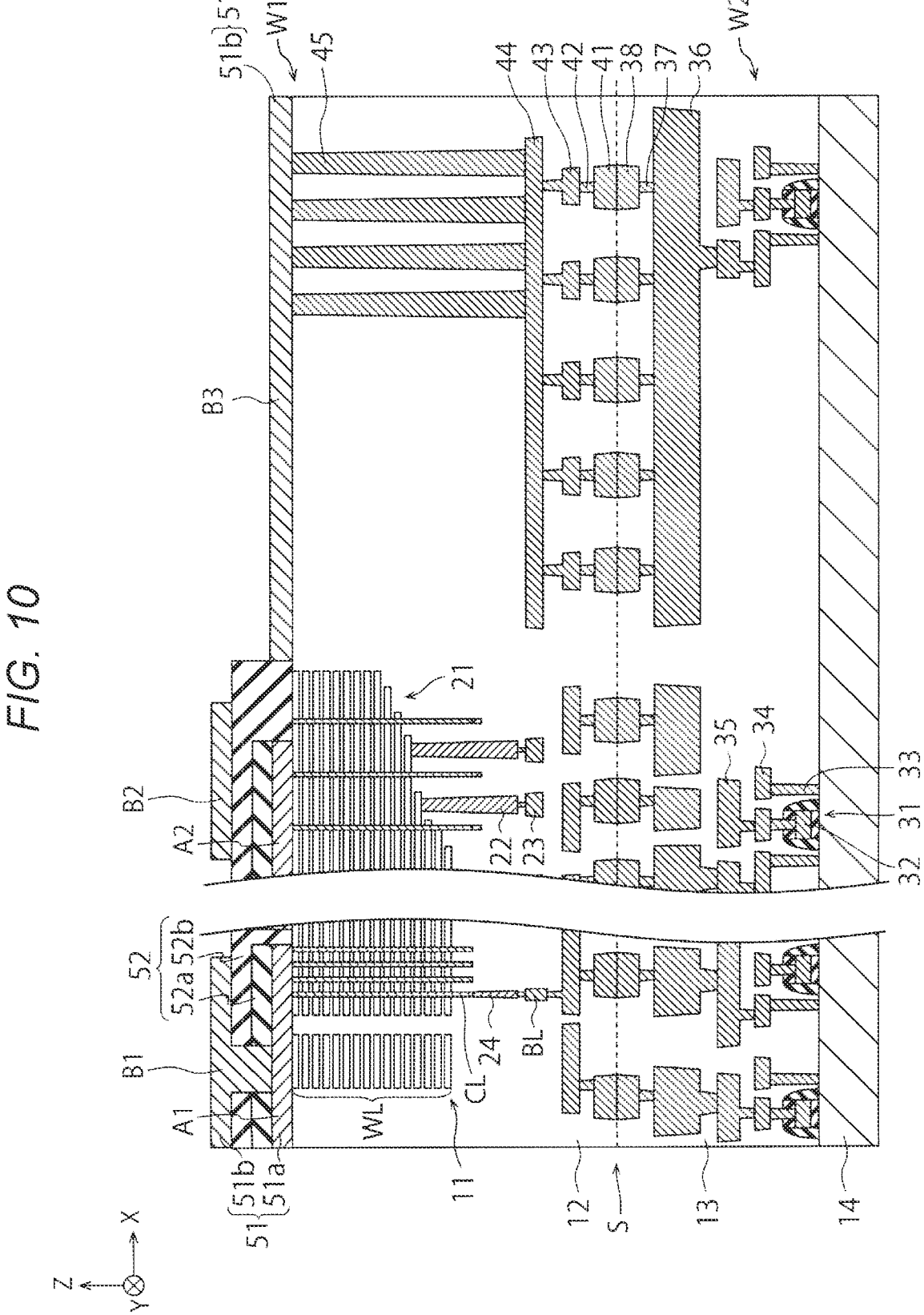
FIG. 10 is a cross-sectional view illustrating the semiconductor device of the first embodiment, during one of various fabrication stages of an example method (4/6).

Next, the metal layer 51*b* is processed by lithography and RIE (FIG. 10). As a result, the metal layer 51*b* is separated into the portions B1, B2, and B3. FIG. 10 illustrates the source layer 51 containing the portions A1 and B1.

Figure 11:
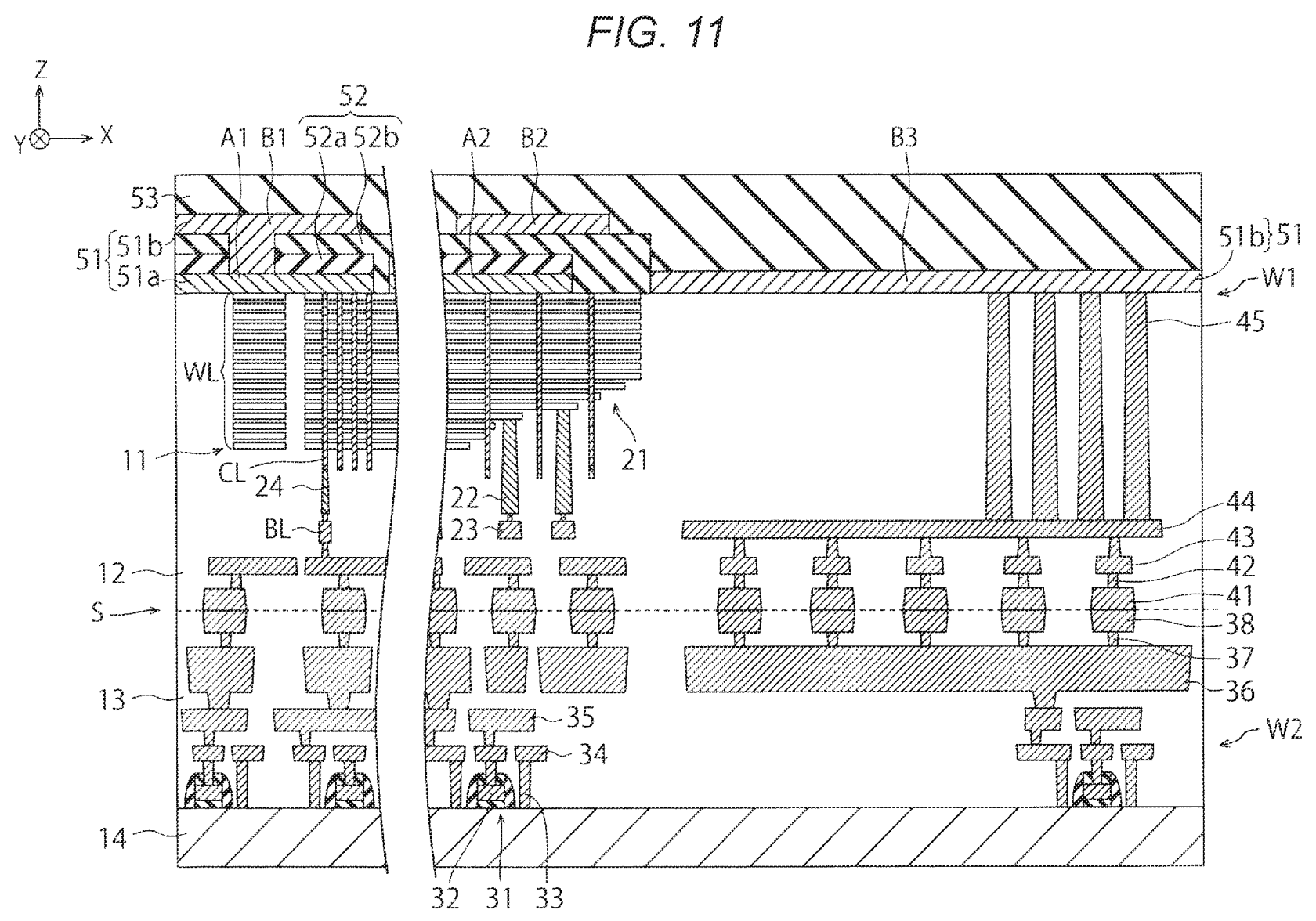

Subsequently, the insulating passivation film 53 is formed on the metal layer 51*b* and the insulating film 52*b* (FIG. 11). As a result, the metal layer 51*b* and the insulating film 52*b* are covered with the insulating passivation film 53.

Figure 12:
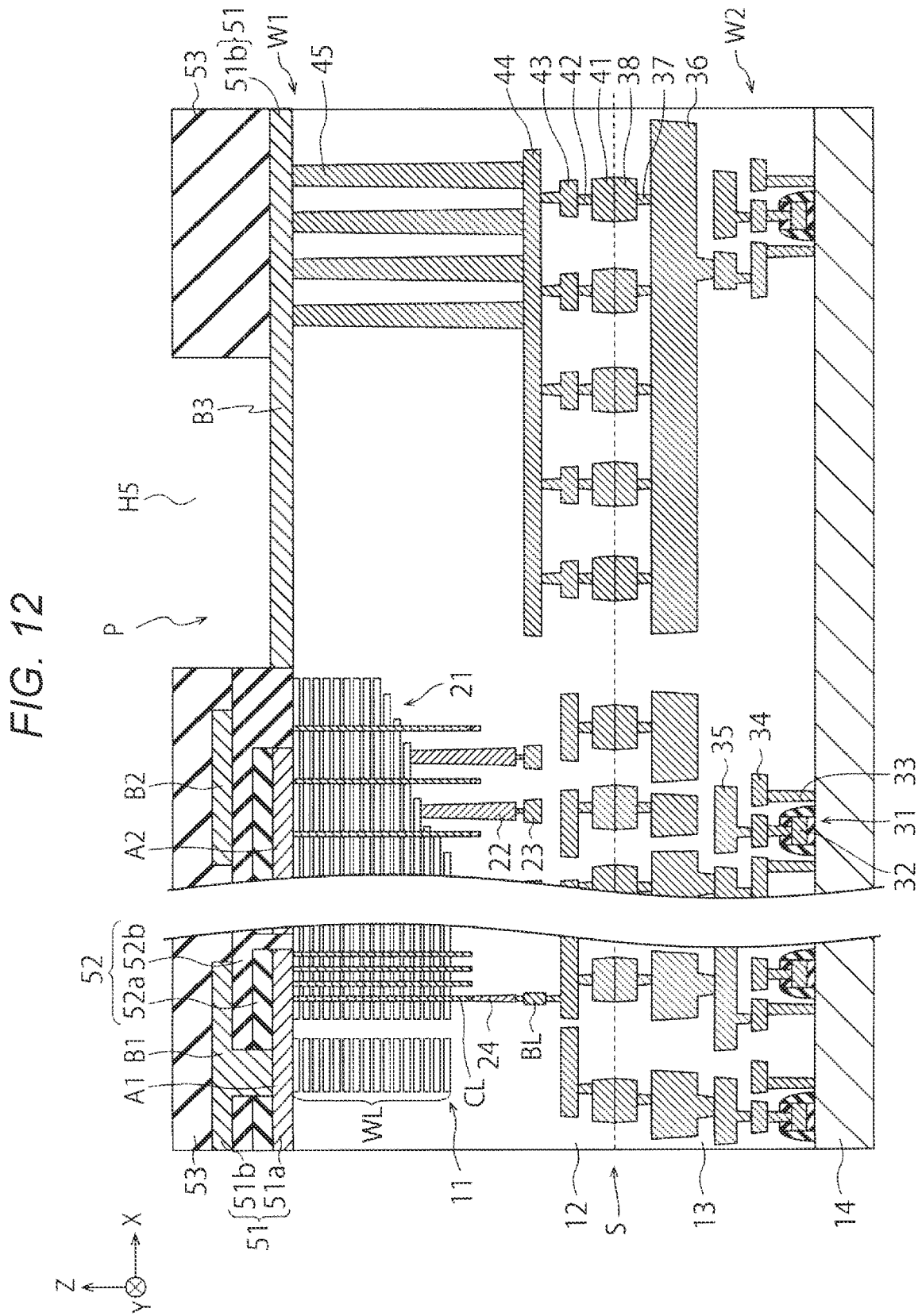
FIG. 12 is a cross-sectional view illustrating the semiconductor device of the first embodiment, during one of various fabrication stages of an example method (6/6).

Next, an opening H5 is formed in the insulating passivation film 53 by lithography and RIE (FIG. 12). As a result, a part of the upper surface of the portion B3 is exposed in the opening H5. The opening H5 corresponds to the aforementioned opening P. A region of the portion B3 exposed in the opening H5 is used as a bonding pad.

Subsequently, the array wafer W1 and the circuit wafer W2 are cut into a plurality of chips. Thus, the semiconductor device of FIG. 1 is manufactured.

FIGS. 13 to 16 are other cross-sectional views illustrating the method for manufacturing the semiconductor device of the first embodiment.

Figure 13:
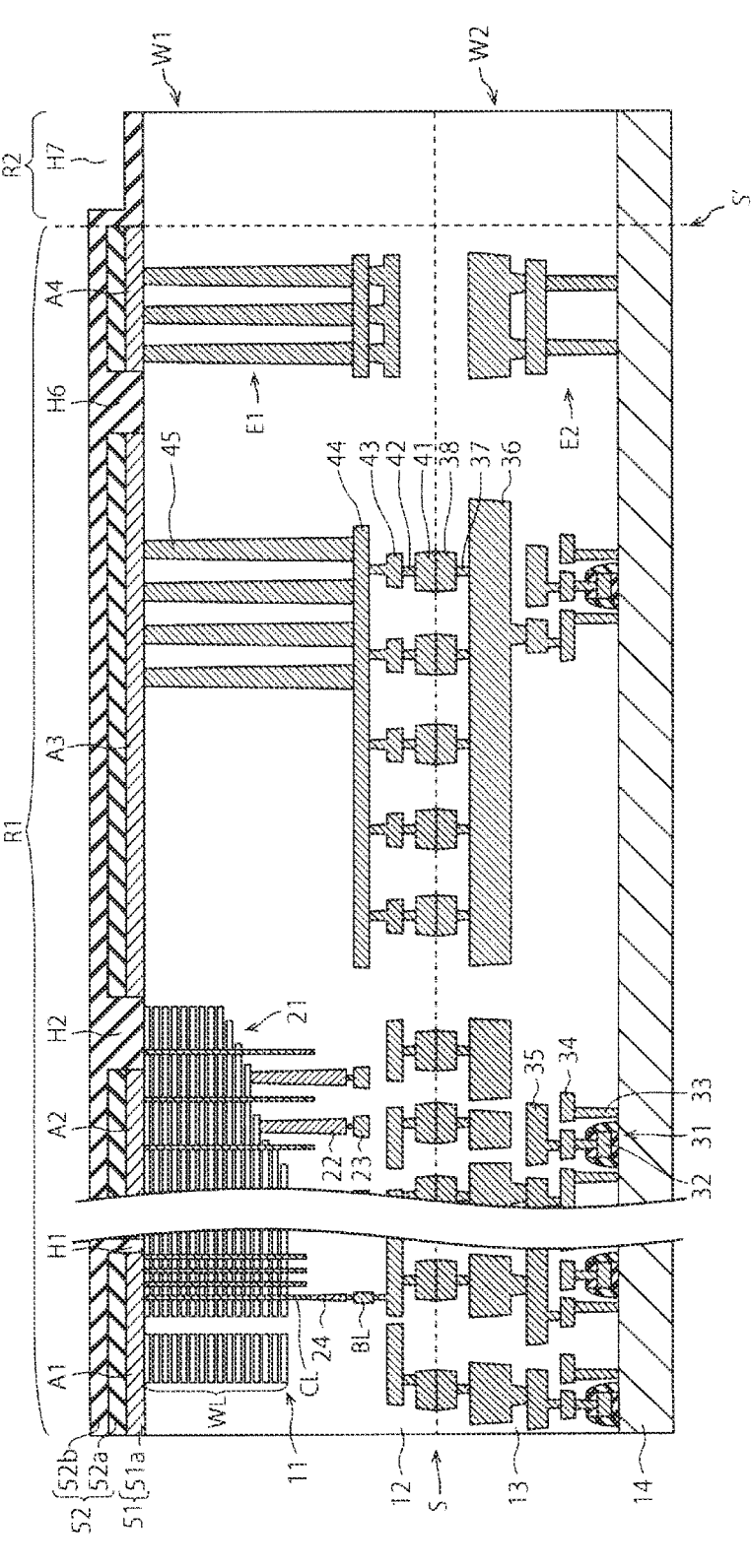
FIG. 13 is another cross-sectional view illustrating the semiconductor device of the first embodiment, during one of various fabrication stages of an example method (1/4).

FIG. 13 illustrates the same process as the process illustrated in FIG. 7. However, FIG. 13 illustrates a chip region R1 and a dicing region (scribing region) R2 in the array wafer W1 and the circuit wafer W2. FIG. 13 further illustrates a boundary surface S' between the chip region R1 and the dicing region R2.

The array wafer W1 and the circuit wafer W2 include a plurality of the chip regions R1. FIG. 13 illustrates one of the chip regions R1. As viewed in plan view, each of the chip regions R1 has a rectangular shape, and the dicing region R2 has a net shape (see FIG. 17 described below). Each of the chip regions R1 is disposed in one mesh of the net of the dicing region R2, and the dicing region R2 is disposed between the chip regions R1 adjacent to each other. When the array wafer W1 and the circuit wafer W2 are cut along the dicing region R2 (dicing), each of the chip regions R1 becomes one chip (semiconductor device). In the substrate 14, each of the chip regions R1 is an example of a first region, and the dicing region R2 is an example of a second region.

As illustrated in FIG. 13, the array wafer W1 and the circuit wafer W2 include guard rings E1 and E2, respectively, at each of the chip regions R1. The guard rings E1 and E2 are provided near the boundary surface S' between each of the chip regions R1 and the dicing region R2, and have a ring shape as viewed in plan view. The guard ring E1 of the embodiment is formed from the same material as the materials for the wiring layers 43 and 44 and the via plugs 45. In contrast, the guard ring E2 of the embodiment is formed from the same material as the materials for the contact plugs 33 and the wiring layers 34, 35, and 36. For example, the guard rings E1 and E2 protect side surfaces of the chips after dicing or to prevent peeling of the interlayer insulating films 12 and 13.

Figure 14:
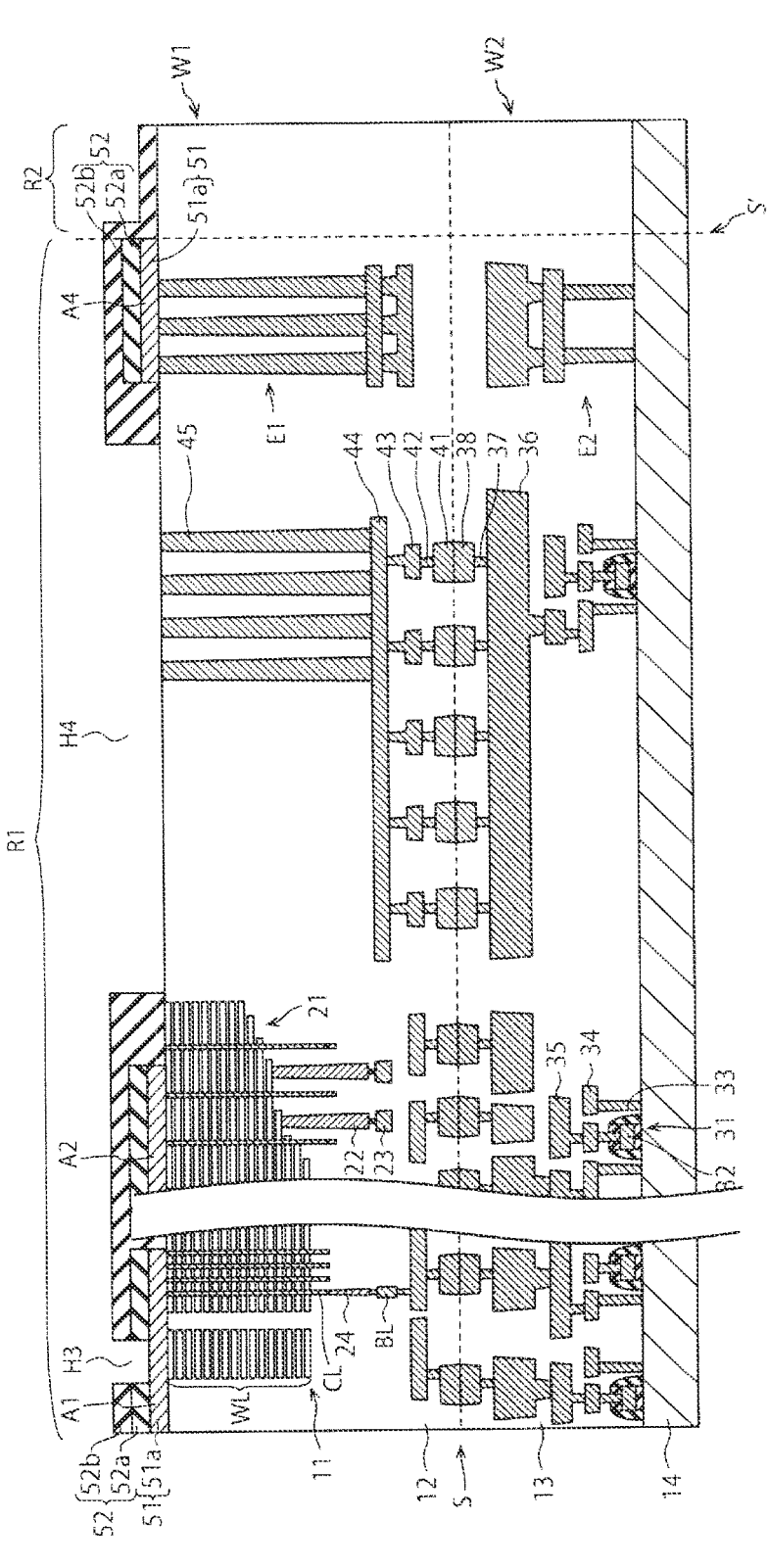
FIG. 14 is still another cross-sectional view illustrating the semiconductor device of the first embodiment, during one of various fabrication stages of an example method (2/4).
Figure 15:
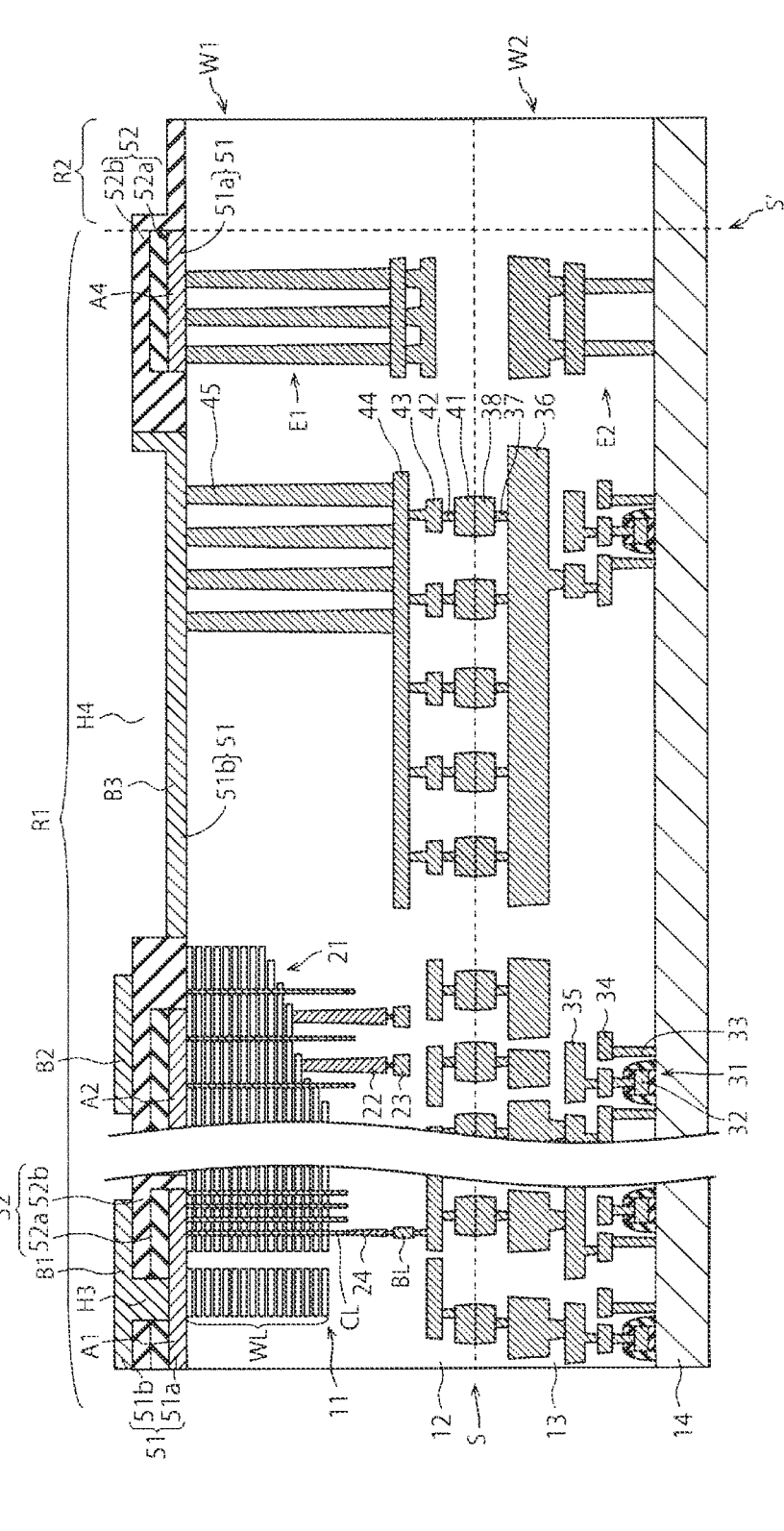
FIG. 15 is yet another cross-sectional view illustrating the semiconductor device of the first embodiment, during one of various fabrication stages of an example method (3/4).
Figure 16:
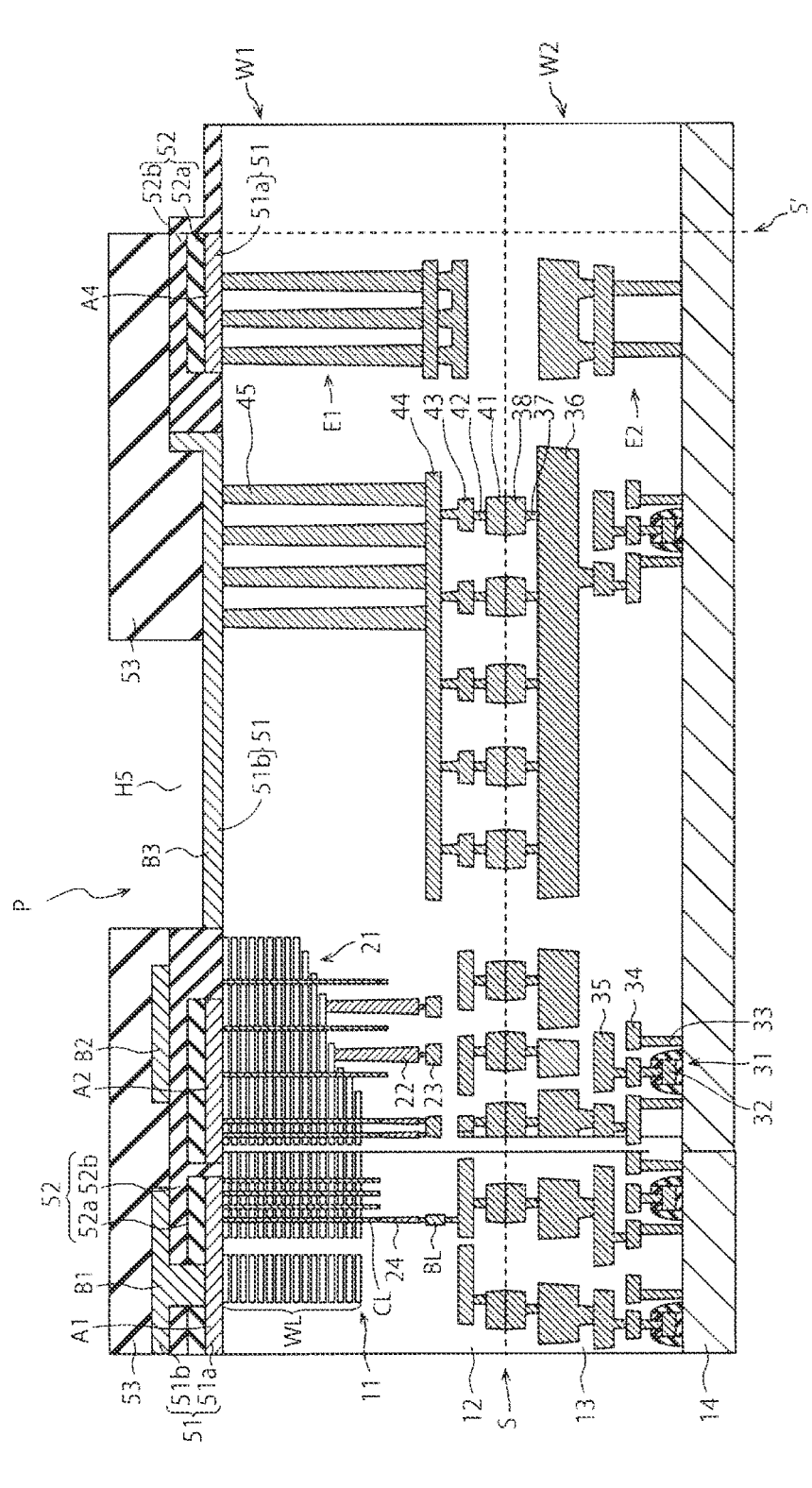
FIG. 16 is further another cross-sectional view illustrating the semiconductor device of the first embodiment, during one of various fabrication stages of an example method (4/4).

As described above, FIG. 13 illustrates the same process as the process illustrated in FIG. 7. FIG. 14 illustrates the same process as the process illustrated in FIG. 8. FIG. 15 illustrates the same process as the processes illustrated in FIGS. 9 and 10. FIG. 16 illustrates the same process as the processes illustrated in FIGS. 11 and 12.

Hereinafter, the processes illustrated in FIGS. 13 to 16 will be described. In this description, a content common to the processes illustrated in FIGS. 7 to 12 is appropriately omitted.

The semiconductor layer 51a is first formed on the memory cell array 11, the interlayer insulating film 12, and the via plugs 45, and the insulating film 52a is formed on the semiconductor layer 51a (FIG. 13). Subsequently, the openings H1 and H2 are formed in the insulating film 52a and the semiconductor layer 51a by lithography and RIE (FIG. 13). In this embodiment, openings H6 and H7 are further formed in the insulating film 52a and the semiconductor layer 51a by the lithography and RIE. As a result, the semiconductor layer 51a is separated into portions A1, A2, A3, and A4. The portion A3 is formed on the via plugs 45, and the portion A4 is formed on the guard ring E1. Next, the insulating film 52b is formed on the insulating film 52a (FIG. 13). As a result, the openings H1, H2, H6, and H7 are filled with the insulating film 52b.

The opening H7 of the embodiment is formed right above the substrate 14 and the interlayer insulating films 13 and 12 at the dicing region R2. In the process illustrated in FIG. 13, the semiconductor layer 51a and the insulating film 52a are removed at the dicing region R2. Thus, the semiconductor layer 51a and the insulating film 52a remain only at each of the chip regions R1 among the chip regions R1 and the dicing region R2. When the semiconductor layer 51a remains at the dicing region R2, this semiconductor layer 51a may adversely affect dicing described below. According to the embodiment, such an adverse effect can be reduced by removing the semiconductor layer 51a at the dicing region R2 in the process illustrated in FIG. 13.

Next, the opening H3 is formed in the insulating films 52b and 52a, and the opening H4 is formed in the insulating films 52b and 52a and the semiconductor layer 51a, by lithography and RIE (FIG. 14). As a result, the portion A1 is exposed in the opening H3, and the via plugs 45 are exposed in the opening H4.

Subsequently, the metal layer 51b is formed on the interlayer insulating film 12, the via plugs 45, the semiconductor layer 51a, and the insulating film 52b (FIG. 15). As a result, the openings H3 and H4 and the like are filled with the metal layer 51b. Next, the metal layer 51b is processed by lithography and RIE (FIG. 15). As a result, the metal layer 51b is separated into the portions B1, B2, and B3.

Subsequently, the insulating passivation film 53 is formed on the metal layer 51b and the insulating film 52b (FIG. 16). As a result, the metal layer 51b and the insulating film 52b are covered with the insulating passivation film 53. Next, an opening H5 is formed in the insulating passivation film 53 by lithography and RIE (FIG. 16). The opening H5 corresponds to the aforementioned opening P.

Subsequently, the array wafer W1 and the circuit wafer W2 are cut into a plurality of chips. For example, when the array wafer W1 and the circuit wafer W2 are cut along the dicing region R2, the chip regions R1 become chips. When the semiconductor layer 51a remains at the dicing region R2, peeling may be caused by the semiconductor layer 51a. According to the embodiment, such peeling can be reduced by removing the semiconductor layer 51a at the dicing region R2 in advance. Thus, the semiconductor device of FIG. 1 is manufactured.

As described above, the portion B3 (bonding pad) of the metal layer 51b of the embodiment is disposed on the interlayer insulating film 12 without the semiconductor layer 51a interposed between the portion B3 and the interlayer insulating film 12. According to the embodiment, the problems caused by the semiconductor layer 51a, for example, the problems about the parasitic capacitance and the step caused by the semiconductor layer 51a can be reduced.

Second Embodiment

Figure 17:
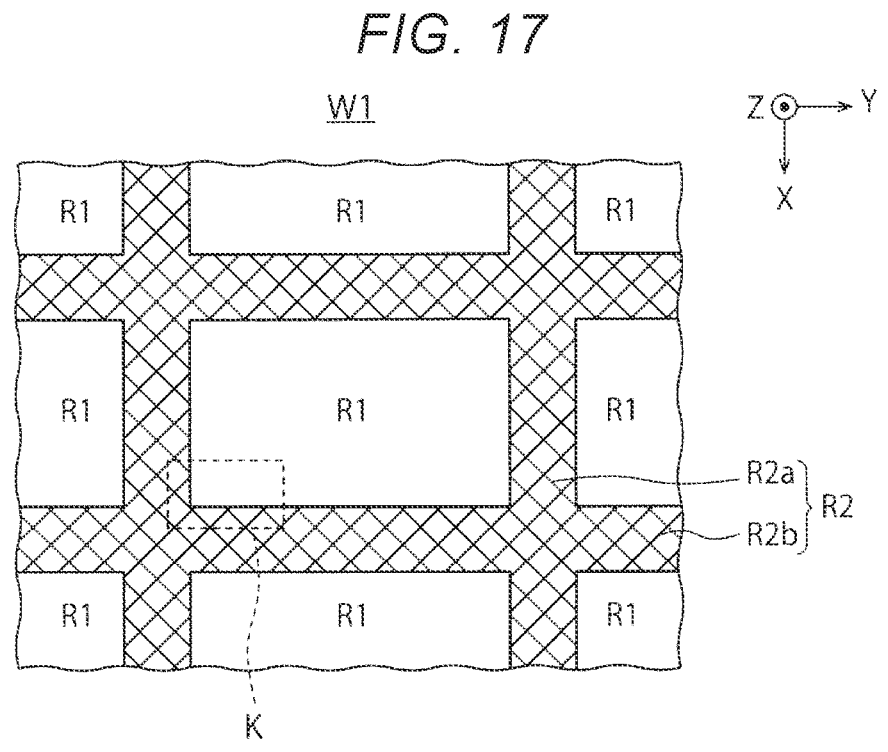

FIG. 17 is a plan view illustrating a method for manufacturing a semiconductor device of a second embodiment.

FIG. 17 illustrates the same process as the process illustrated in FIG. 16, and specifically illustrates a plurality of the chip regions R1 and the dicing region R2 in the array wafer W1 before dicing. The dicing region R2 includes a plurality of regions R2a extending in the X direction, and a plurality of regions R2b extending in the Y direction. The dicing region R2 has a net shape that is formed by the regions R2a and R2b. In FIG. 17, the chip regions R1 are represented by white, and the dicing region R2 is represented by cross hatching. As for the chip regions R1 and the dicing region R2, the circuit wafer W2 has a structure illustrated in FIG. 17 like the array wafer W1.

Figure 18:
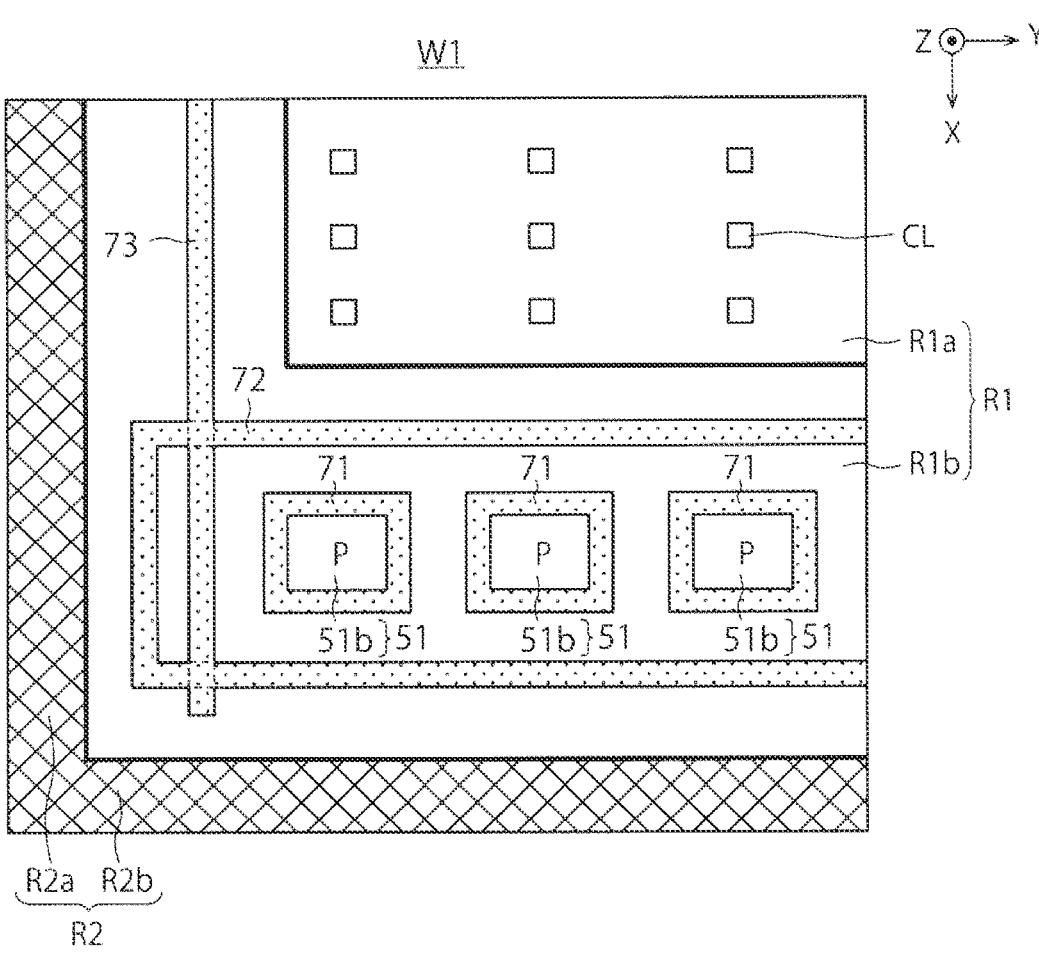
FIG. 18 is another plan view illustrating the semiconductor device of the second embodiment, during one of various fabrication stages of an example method.

FIG. 18 is still another plan view illustrating the method for manufacturing a semiconductor device of the second embodiment.

FIG. 18 is an enlarged view of a region K illustrated in FIG. 17. Each of the chip regions R1 of the embodiment contains a cell region R1*a* and a peripheral region R1*b* as illustrated in FIG. 18. The cell region R1*a* contains the memory cell array 11 (see FIG. 1). The peripheral region R1*b* contains a peripheral circuit, for example, a control circuit such as the transistors 31 (see FIG. 1). FIG. 18 illustrates the columnar portions CL at the cell region R1*a*, and the metal layers 51*b* exposed in a plurality of the openings P at the peripheral region R1*b*. In FIG. 1 and the like, one of the openings P is illustrated. The metal layer 51*b* exposed in each of the openings P functions as a bonding pad.

In FIG. 18, recess portions 71, 72, and 73 disposed in the semiconductor layer 51*a* are represented by dot hatching. In the embodiment, the recess portions 71, 72, and 73 extend through the semiconductor layer 51*a*. Each of the openings P (bonding pad) of the embodiment is disposed in each of the recess portions 71 as viewed in plan view. Details of the semiconductor layer 51*a* will be described below with reference to FIG. 19.

Figure 19:
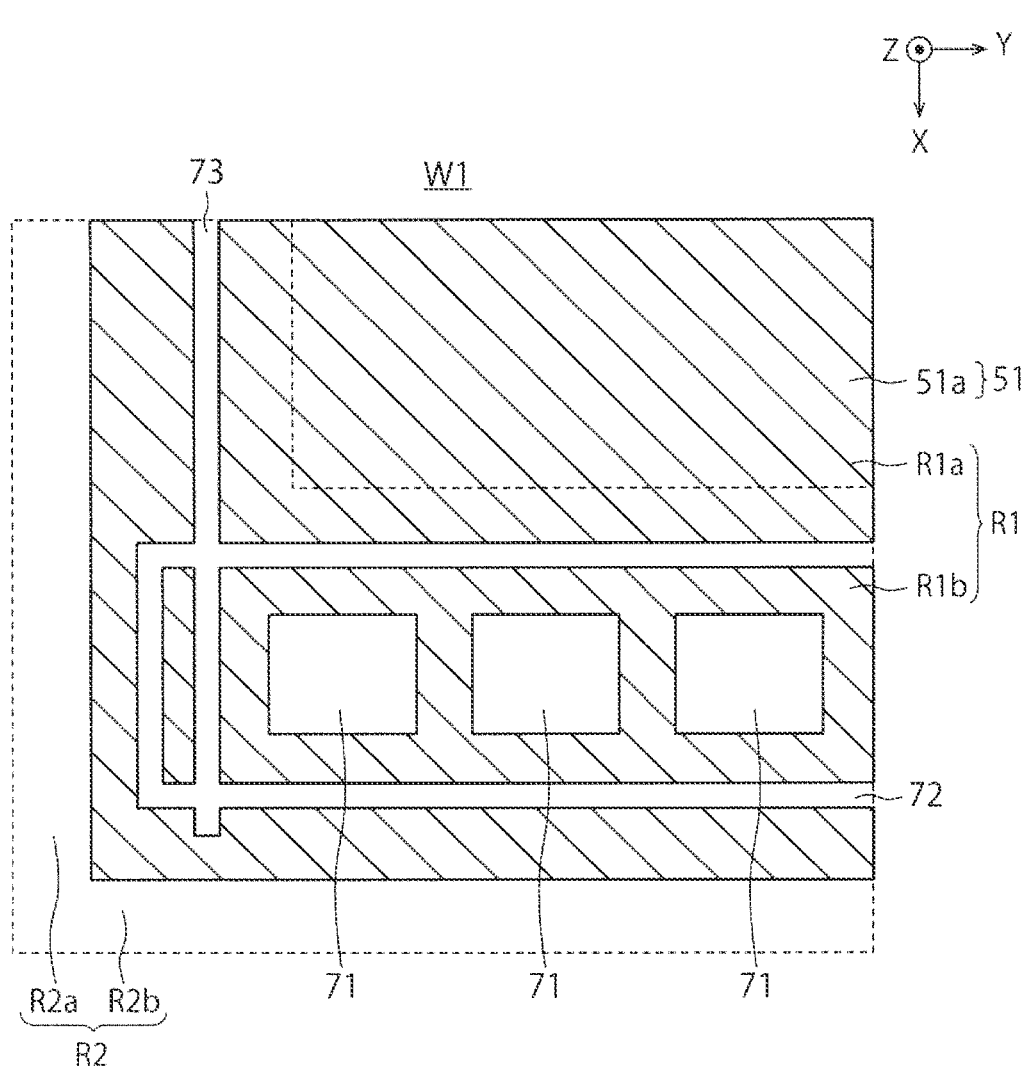
FIG. 19 is still another plan view illustrating the semiconductor device of the second embodiment, during one of various fabrication stages of an example method.

FIG. 19 is another plan view illustrating the method for manufacturing a semiconductor device of the second embodiment.

FIG. 19 is an enlarged view of the region K illustrated in FIG. 17, like FIG. 18. FIG. 19 illustrates a plane shape of the semiconductor layer 51*a*. In FIG. 19, a region where the semiconductor layer 51*a* is disposed is represented by hatching, and a region where the semiconductor layer 51*a* is not disposed is represented by white.

As illustrated in FIG. 19, the semiconductor layer 51*a* of the embodiment includes the recess portions 71, 72, and 73. The recess portion 71 has a hole having a rectangular plane shape. The recess portion 72 is a groove surrounding the recess portion 71 and having a circular plane shape. The recess portion 73 is a groove having a linear plane shape and intersecting the recess portion 72. The recess portion 71 has four sides parallel to the X or Y direction as viewed in plan view. The recess portion 72 extends in the X and Y directions. The recess portion 73 extends in the X direction. The semiconductor layer 51*a* of the embodiment remains only at each of the chip regions R1 among the chip regions R1 and the dicing region R2.

Since the semiconductor layer 51*a* of the embodiment includes the recess portions 71, 72, and 73, the semiconductor layer 51*a* does not remain at the whole of the chip regions R1 and remains only at a part of the chip regions R1 in FIG. 19. When the semiconductor layer 51*a* remains at the whole of the chip regions R1, peeling caused by the semiconductor layer 51*a* may occur during annealing of the memory cell array 11. According to the embodiment, such peeling can be reduced by the semiconductor layer 51*a* remaining only at a part of the chip regions R1.

In the embodiment, the proportion of the total area of the recess portions 71, 72, and 73 in the total area of the semiconductor layer 51*a* and the recess portions 71, 72, and 73 as viewed in plan view is set to 10% to 15%. The relationship of this proportion is represented by "0.10≤Sb/(Sa+Sb)≤0.15", wherein Sa is the total area of the semiconductor layer 51*a* as viewed in plan view and Sb is the total area of the recess portions 71, 72, and 73 as viewed in plan view. The value of Sb/(Sa+Sb) can be determined, for example, by dividing the total area of the recess portions 71, 72, and 73 at each of the chip regions R1 by the area of each of the chip regions R1.

It is desirable that the widths of the recess portions 72 and 73 (grooves) of the embodiment be set to be small. This is because the recess portions 72 and 73 can be filled with a thin insulating film. The widths of the recess portions 72 and 73 of the embodiment are set to 500 nm or less, for example. When certain portions of the recess portions 72 and 73 extend in the X direction, the widths of the certain portions of the recess portions 72 and 73 are the dimensions in the Y direction of the recess portions 72 and 73. In contrast, when certain portions of the recess portions 72 and 73 extend in the Y direction, the widths of the certain portions of the recess portions 72 and 73 are the dimensions in the X direction of the recess portions 72 and 73.

Figure 20:
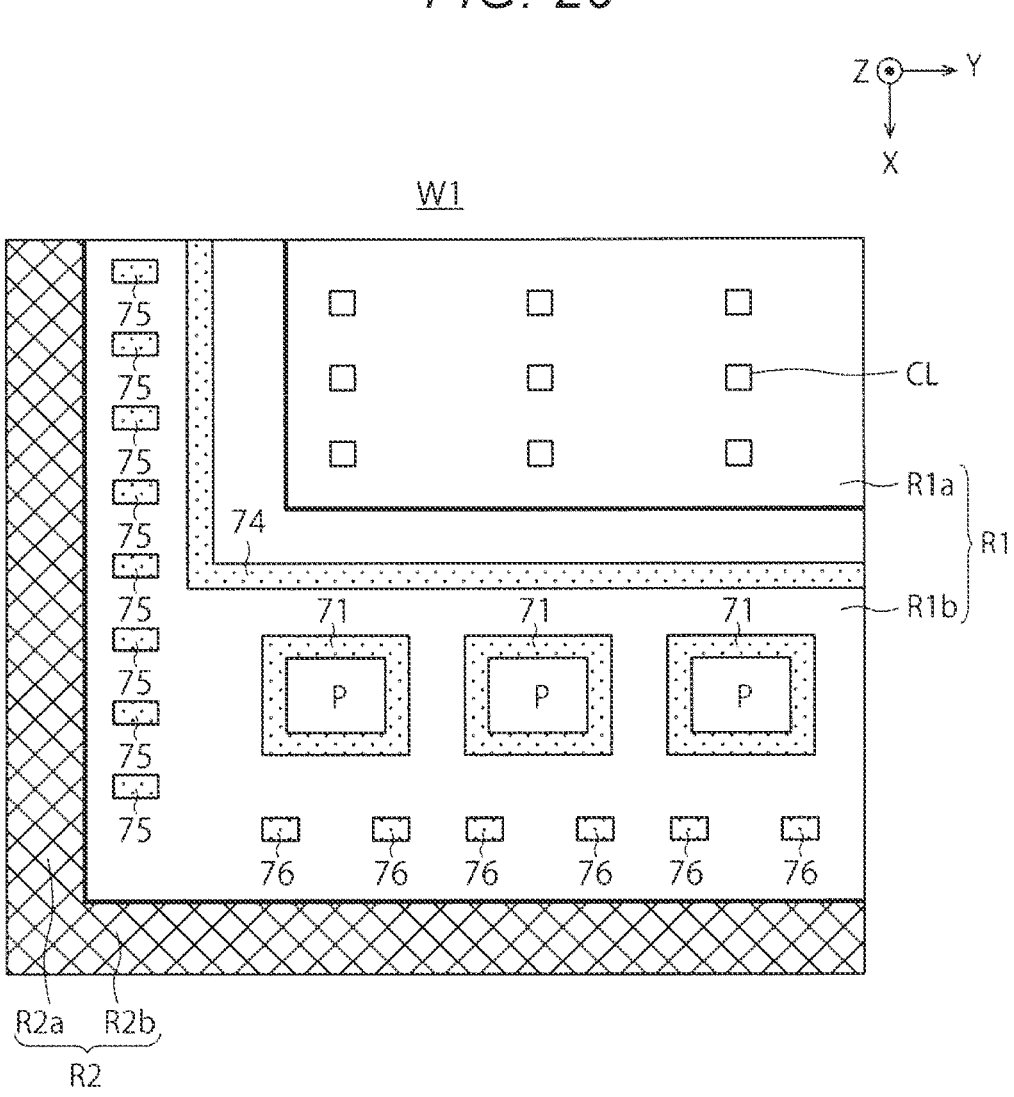
FIG. 20 is a plan view illustrating a semiconductor device of Modified Example of the second embodiment, during one of various fabrication stages of an example method.

FIG. 20 is a plan view illustrating a method for manufacturing a semiconductor device of Modified Example of the second embodiment.

FIG. 20 is an enlarged view of the region K illustrated in FIG. 17, like FIG. 18. The semiconductor layer 51*a* of Modified Example includes recess portions 74, 75, and 76 instead of the recess portions 72 and 73, as illustrated in FIG. 20. The recess portion 74 is a groove extending in the X and Y directions, and the recess portions 75 and 76 are rectangular holes. In Modified Example, the recess portions 71, 74, 75, and 76 extend through the semiconductor layer 51*a*.

It is desirable that the widths of the recess portions 74, 75, and 76 of the embodiment be set to be small. The widths of the recess portions 74, 75, and 76 of the embodiment are set to 500 nm or less, for example. A method for determining the width of the recess portion 74 is the same as a method for determining the widths of the recess portions 72 and 73. On the other hand, the widths of the recess portions 75 and 76 are the lengths of short sides of the recess portions 75 and 76. In Modified Example, the proportion of the total area of the recess portions 71, 74, 75, and 76 in the total area of the semiconductor layer 51*a* and the recess portions 71, 74, 75, and 76 as viewed in plan view is set to 10% to 15%.

FIGS. 21 to 34 are cross-sectional views illustrating the method for manufacturing a semiconductor device of the second embodiment. In this embodiment, the semiconductor device including the recess portions 71, 72, and 73 is manufactured. The semiconductor device of the embodiment may be manufactured by the method described in the first embodiment or by a method illustrated in FIGS. 21 to 34.

Figure 21:
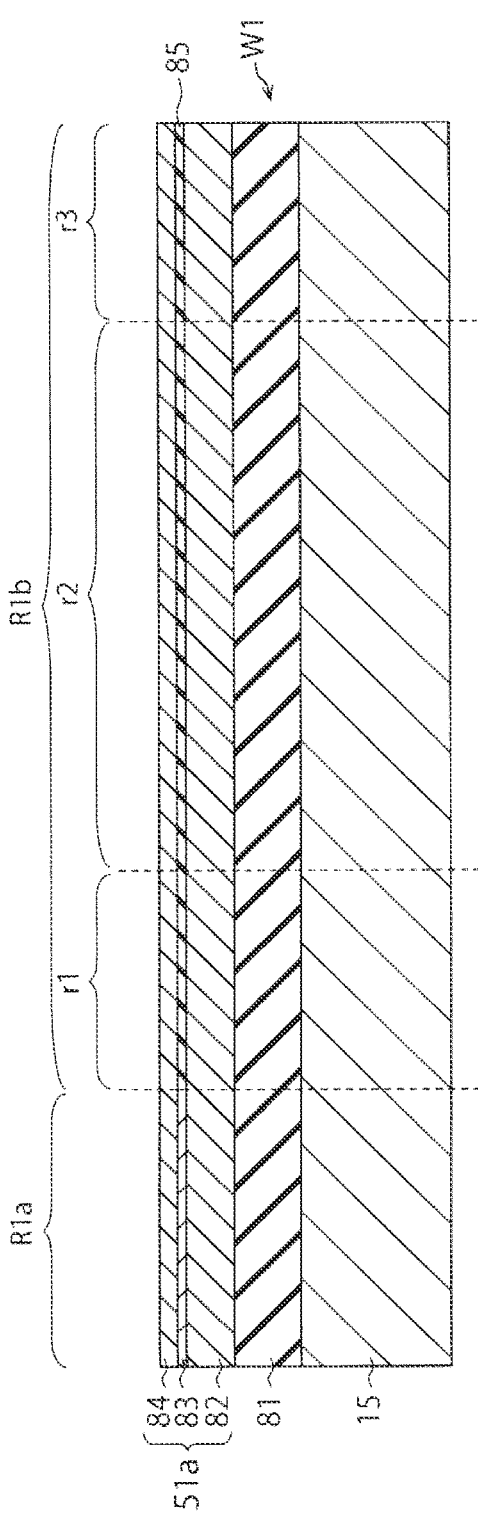
FIG. 21 is a cross-sectional view illustrating the semiconductor device of the second embodiment, during one of various fabrication stages of an example method (1/14).

FIG. 21 illustrates a process of manufacturing the array wafer W1. FIG. 21 illustrates the cell region R1*a* and the peripheral region R1*b* at each of the chip regions R1. FIG. 21 further illustrates a groove region r1, a pad region r2, and a groove region r3 at the peripheral region R1*b*. As described below, the recess portion 72 (groove) is formed at the groove regions r1 and r3, and the recess portion 71 (hole) is formed at the pad region r2.

An insulating film 81, a semiconductor layer 82, an insulating film 85, and a semiconductor layer 84 are formed in order on the whole surface of the substrate 15, and a part of the insulating film 85 is replaced by a semiconductor layer 83 (FIG. 21). For example, the insulating film 81 is a $SiO_2$ film. For example, the semiconductor layers 82, 83, and 84 are polysilicon layers, and are used to form the semiconductor layer 51*a*. For example, the insulating film 85 is a SiN film. In this embodiment, the insulating film 85 is removed at the cell region R1*a* to form a cavity between the semiconductor layers 82 and 84, the cavity is filled with the semiconductor layer 83 to form the semiconductor layer 83 between the semiconductor layers 82 and 84. As a result, the semiconductor layer 51a including the semiconductor layers 82, 83, and 84 is formed at the cell region R1a, and the semiconductor layer 51a including the semiconductor layers 82 and 84 is formed at the peripheral region R1b.

Figure 22:
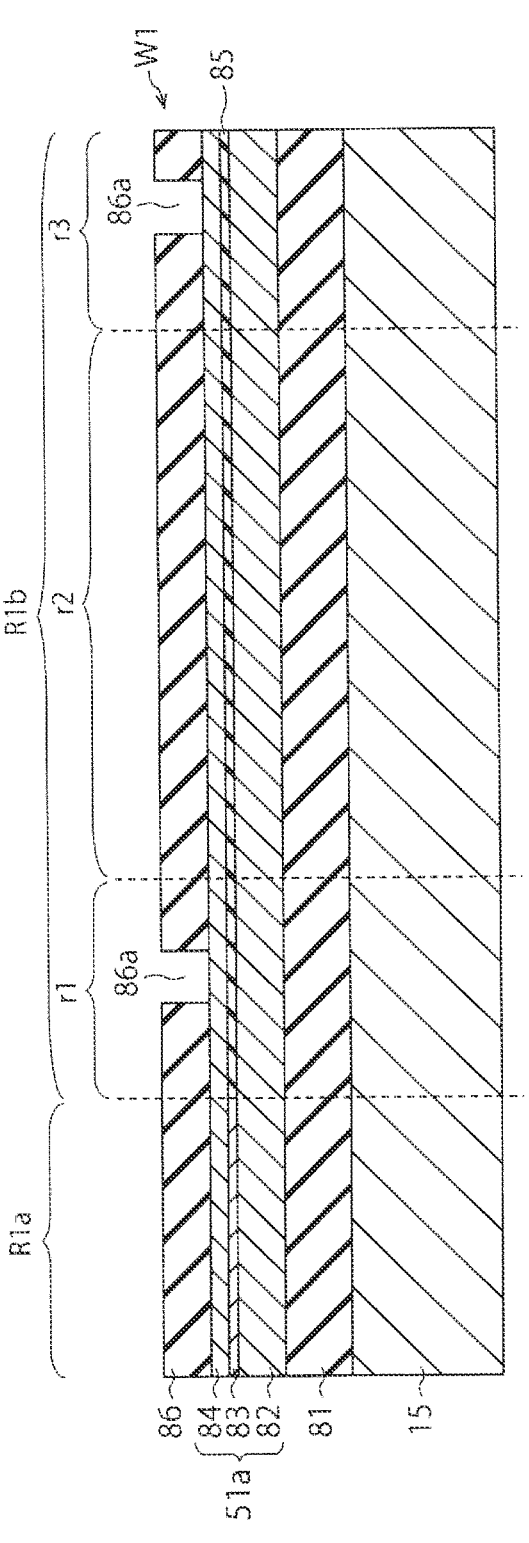
FIG. 22 is a cross-sectional view illustrating the semiconductor device of the second embodiment, during one of various fabrication stages of an example method (2/14).

Next, a resist film 86 is formed on the semiconductor layer 84, and an opening 86a is formed in the resist film 86 (FIG. 22). FIG. 22 illustrates two openings 86a each having a circular plane shape. The openings 86a are formed at the groove regions r1 and r3.

Figure 23:
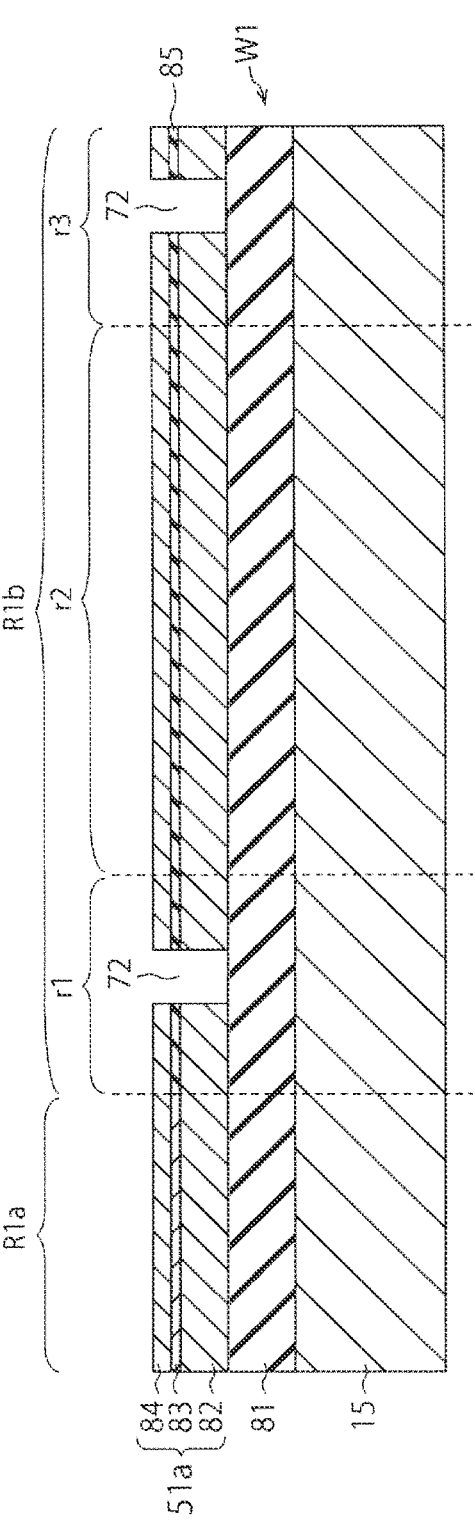
FIG. 23 is a cross-sectional view illustrating the semiconductor device of the second embodiment, during one of various fabrication stages of an example method (3/14).

Next, the openings 86a are transferred to the semiconductor layer 84, the insulating film 85, and the semiconductor layer 82 by RIE using the resist film 86 (FIG. 23). As a result, the recess portion 72 that extends through the semiconductor layer 84, the insulating film 85, and the semiconductor layer 82 is formed at the groove region r1 and r3. FIG. 23 illustrates two recess portions 72 each having a circular plane shape. In the processes illustrated in FIGS. 22 and 23, the recess portion 73 may be further formed.

Figure 24:
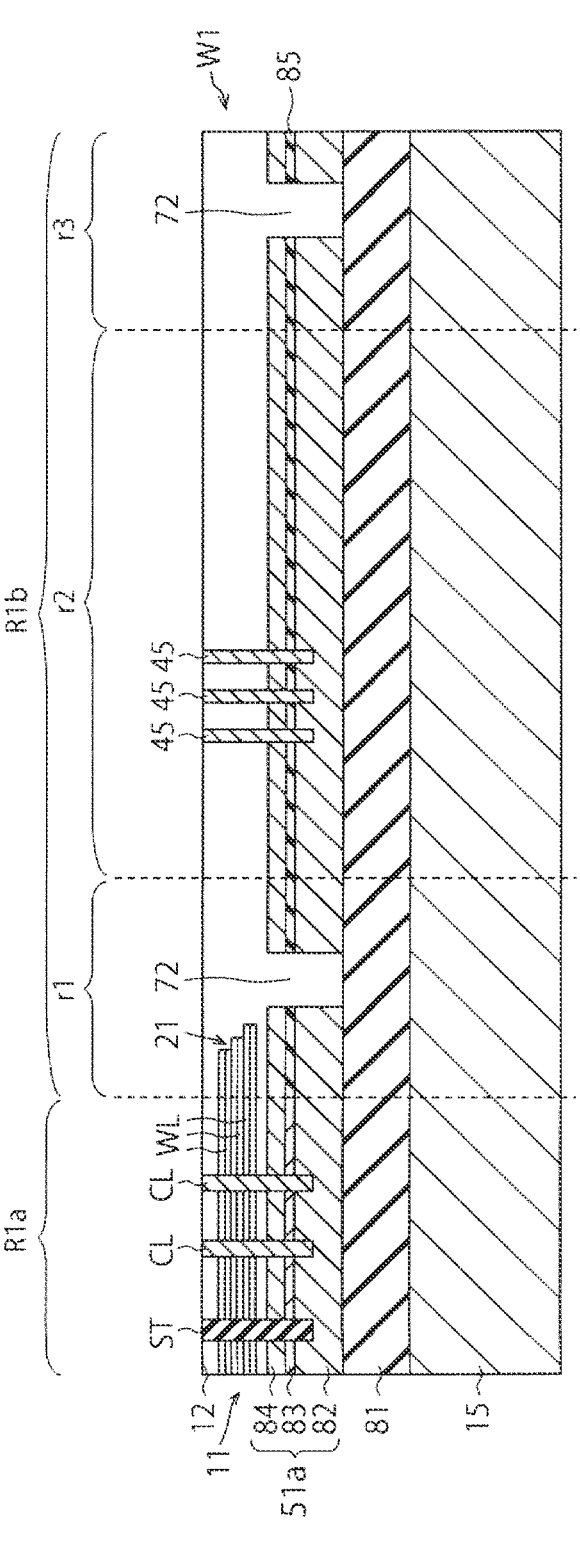
FIG. 24 is a cross-sectional view illustrating the semiconductor device of the second embodiment, during one of various fabrication stages of an example method (4/14).

Next, the memory cell array 11, the interlayer insulating film 12, the columnar portions CL, a slit insulating film ST, the via plugs 45, and the like are formed on the semiconductor layer 51a (FIG. 24). As a result, the recess portions 72 are filled with a part of the interlayer insulating film 12. A stacked film including a plurality of the insulating layers 61 (FIG. 2) and a plurality of sacrificial layers that are alternated is formed, a slit is formed in the stacked film, and the sacrificial layers are removed from the slit, to obtain a plurality of cavities. A plurality of the word lines WL are formed in the cavities, and the slit insulating film ST is formed in the slit. Thus, the memory cell array 11 of the embodiment is formed. For example, the sacrificial layers are SiN films. For example, a process illustrated in FIG. 24 is performed in the same manner as the process illustrated in FIG. 3.

Figure 25:
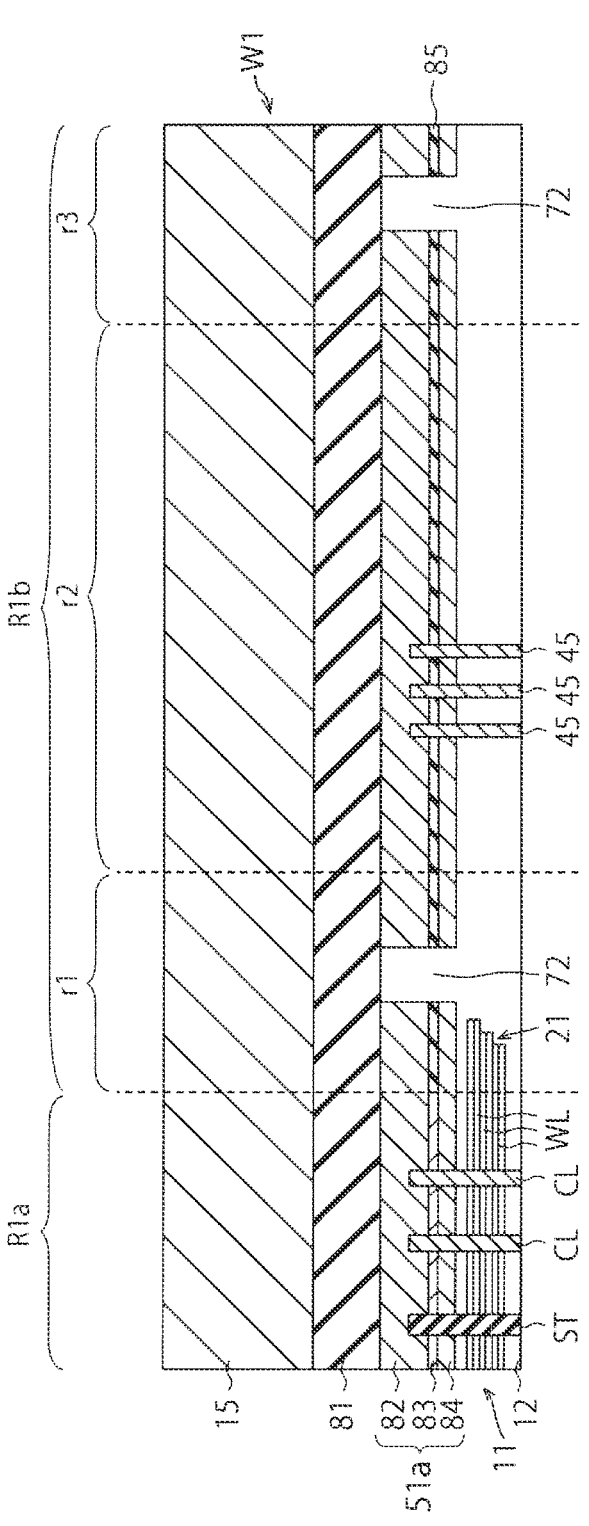
FIG. 25 is a cross-sectional view illustrating the semiconductor device of the second embodiment, during one of various fabrication stages of an example method (5/14).

Next, the array wafer W1 is bonded to the circuit wafer W2 not illustrated (FIG. 25). Therefore, the direction of the array wafer W1 illustrated in FIG. 25 is opposite to the direction of the array chip 1 illustrated in FIG. 24. For example, a process illustrated in FIG. 25 is performed in the same manner as the process illustrated in FIG. 4.

Figure 26:
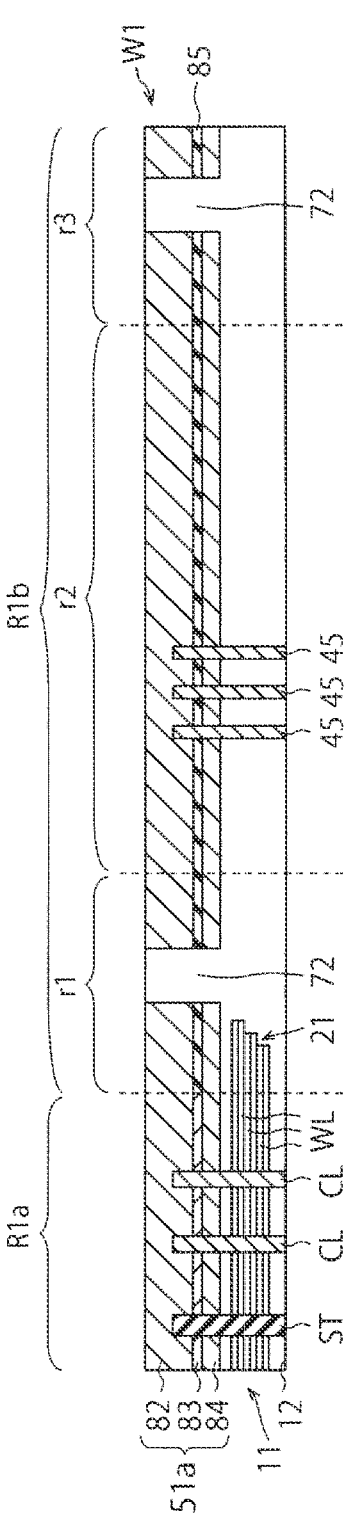
FIG. 26 is a cross-sectional view illustrating the during one of various fabrication stages of an example method semiconductor device of the second embodiment, during one of various fabrication stages of an example method (6/14).

Subsequently, the substrate 15 and the insulating film 81 are removed (FIG. 26). As a result, the upper surface of the semiconductor layer 51a (the semiconductor layer 82) is exposed. For example, the substrate 15 and the insulating film 81 are removed by CMP or etching.

Figure 27:
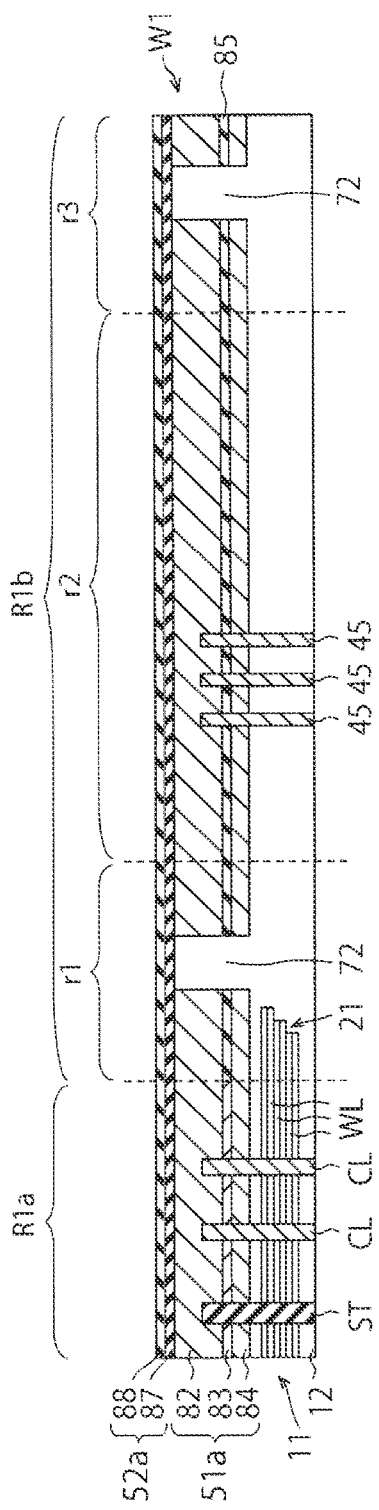
FIG. 27 is a cross-sectional view illustrating the semiconductor device of the second embodiment, during one of various fabrication stages of an example method (7/14).

Next, insulating films 87 and 88 are formed in order on the semiconductor layer 51a (FIG. 27). As a result, the insulating film 52a including the insulating films 87 and 88 is formed on the semiconductor layer 51a. For example, the insulating film 87 is a silicon carbide nitride film (SiCN film). For example, the insulating film 88 is a $SiO_2$ film.

Figure 28:
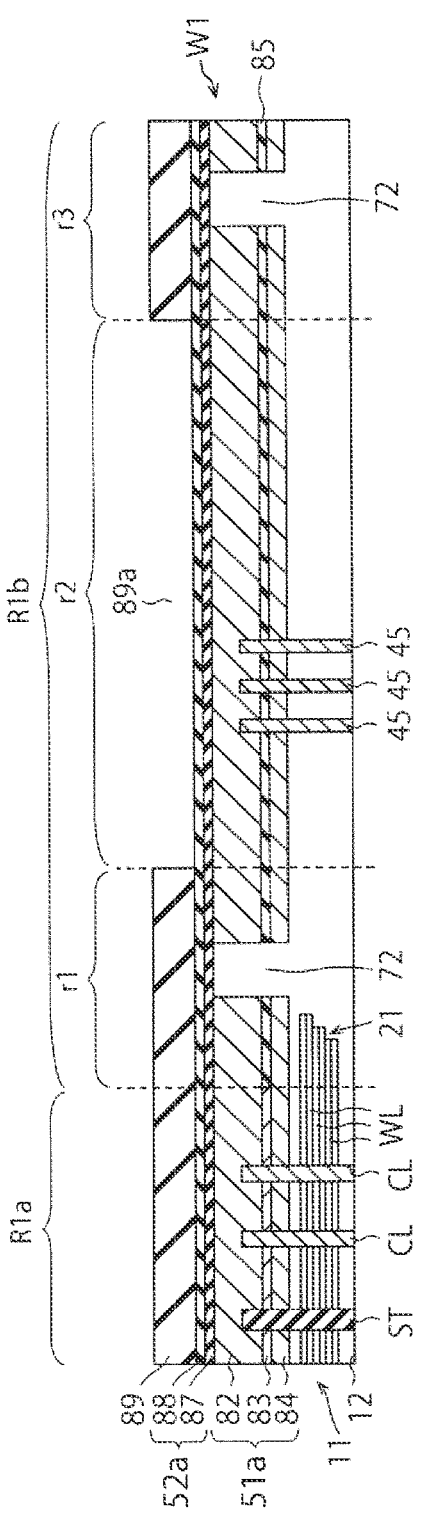
FIG. 28 is a cross-sectional view illustrating the semiconductor device of the second embodiment, during one of various fabrication stages of an example method (8/14).

Next, a resist film 89 is formed on the insulating film 52a, and an opening 89a is formed in the resist film 89 (FIG. 28). The opening 89a is formed at the pad region r2.

Figure 29:
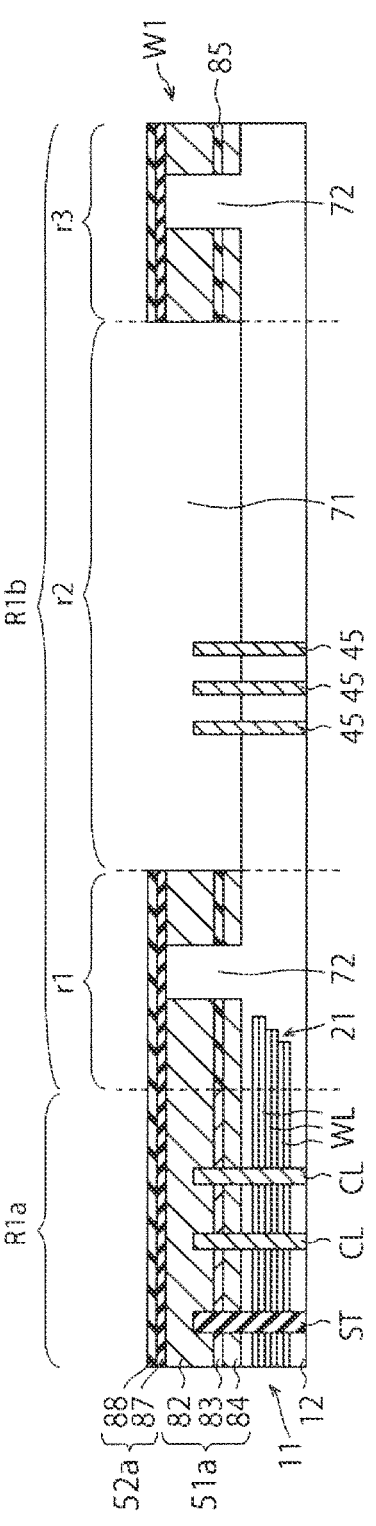
FIG. 29 is a cross-sectional view illustrating the semiconductor device of the second embodiment, during one of various fabrication stages of an example method (9/14).

Subsequently, the opening 89a is transferred to the insulating films 88 and 87, the semiconductor layer 84, the insulating film 85, and the semiconductor layer 82 by RIE using the resist film 89 (FIG. 29). As a result, the recess portion 71 that extends through the insulating films 88 and 87, the semiconductor layer 84, the insulating film 85, and the semiconductor layer 82 is formed at the pad region r2. Furthermore, the via plugs 45 are exposed in the recess portion 71.

Figure 30:
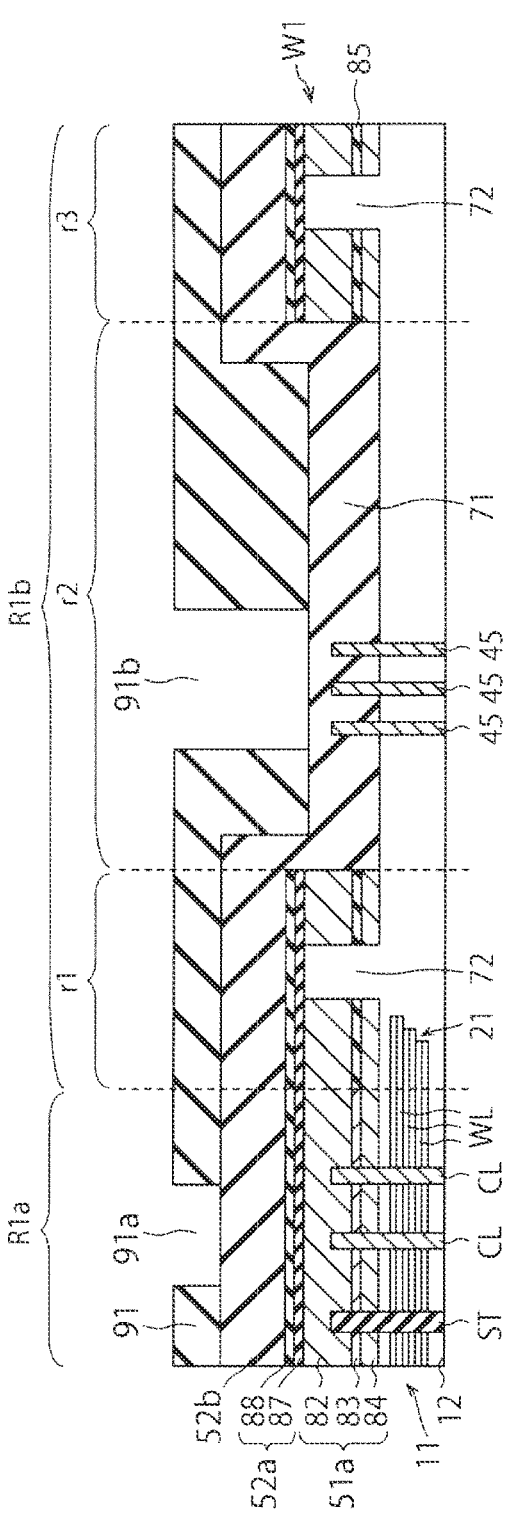
FIG. 30 is a cross-sectional view illustrating the semiconductor device of the second embodiment, during one of various fabrication stages of an example method (10/14).

Next, the insulating film 52b is formed on the insulating film 52a and the like, a resist film 91 is formed on the insulating film 52b, and two openings 91a and 91b are formed in the resist film 91 (FIG. 30). The opening 91a is formed at the cell region R1a, and the opening 91b is formed at the pad region r2.

Figure 31:
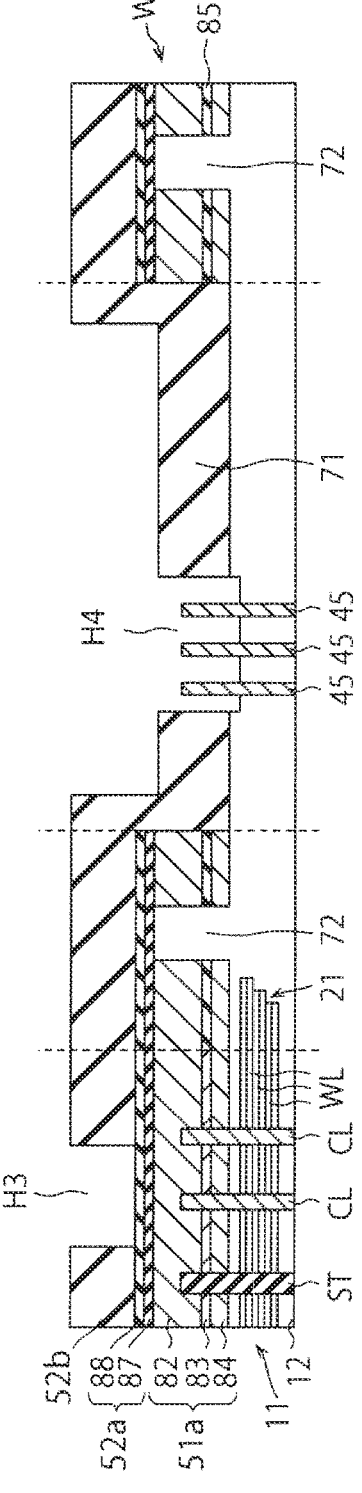
FIG. 31 is a cross-sectional view illustrating the semiconductor device of the second embodiment, during one of various fabrication stages of an example method (11/14).

Next, the openings 91a and 91b are transferred to the insulating film 52b by RIE using the resist film 91 (FIG. 31). As a result, the openings H3 and H4 that extend through the insulating film 52b are formed at the cell region R1a and the pad region r2, respectively. Furthermore, the via plugs 45 are exposed in the opening H4.

Figure 32:
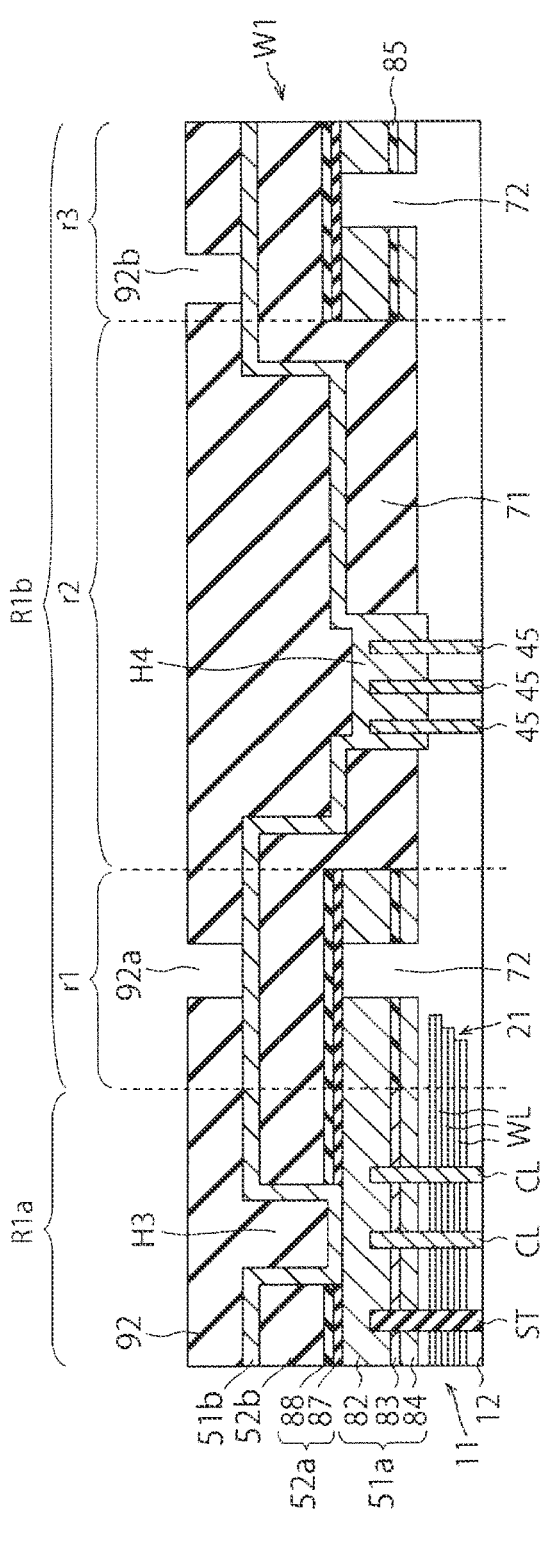
FIG. 32 is a cross-sectional view illustrating the semiconductor device of the second embodiment, during one of various fabrication stages of an example method (12/14).

Subsequently, the metal layer 51b is formed on the insulating film 52b and the like, a resist film 92 is formed on the metal layer 51b, and two openings 92a and 92b are formed in the resist film 92 (FIG. 32). The opening 92a is formed at the groove region r1, and the opening 92b is formed at the groove region r3. The metal layer 51b illustrated in FIG. 32 is formed also in the openings H3 and H4.

Figure 33:
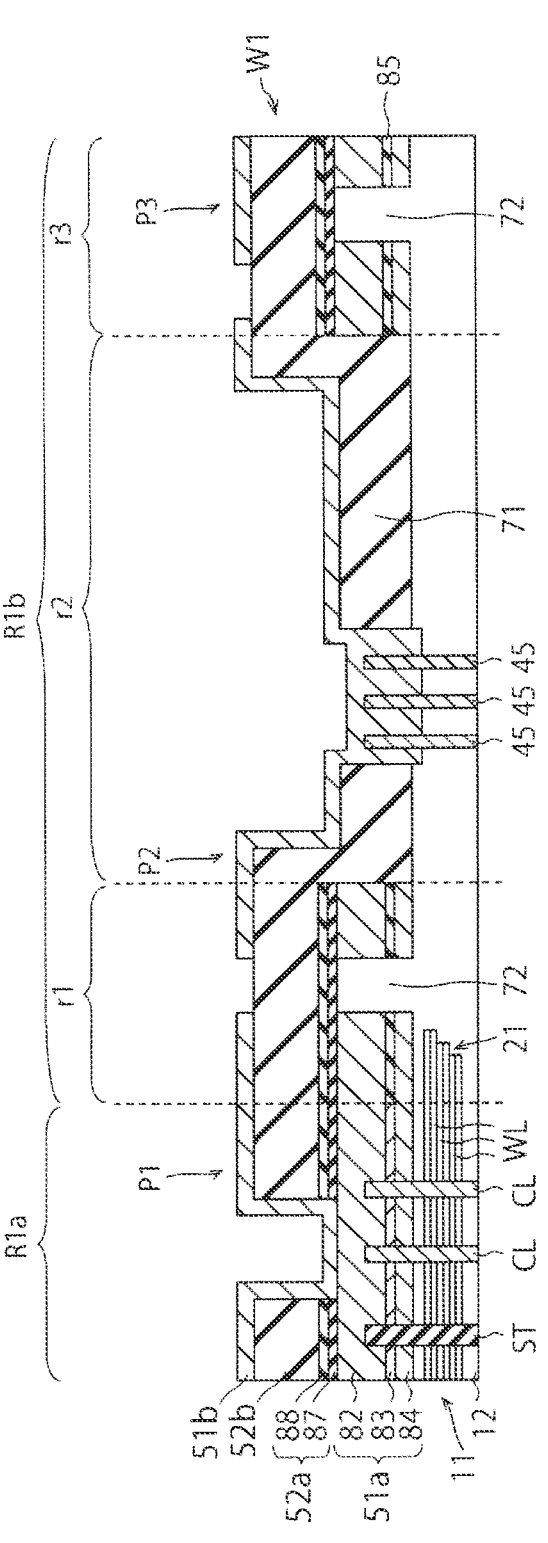
FIG. 33 is a cross-sectional view illustrating the semiconductor device of the second embodiment, during one of various fabrication stages of an example method (13/14).

Next, the openings 92a and 92b are transferred to the metal layer 51b by RIE using the resist film 92 (FIG. 33). As a result, the metal layer 51b is separated into portions P1, P2, and P3. The portion P1 is formed on the semiconductor layer 51a in the opening H3. The portion P1 forms the source layer 51 with the semiconductor layer 51a. The portion P1 is disposed at the cell region R1a and the groove region r1. The portion P2 is formed on the via plugs 45 in the opening H4. The portion P2 is formed at the groove region r1 and the pad region r2. The portion P3 is disposed at the groove region r3.

Figure 34:
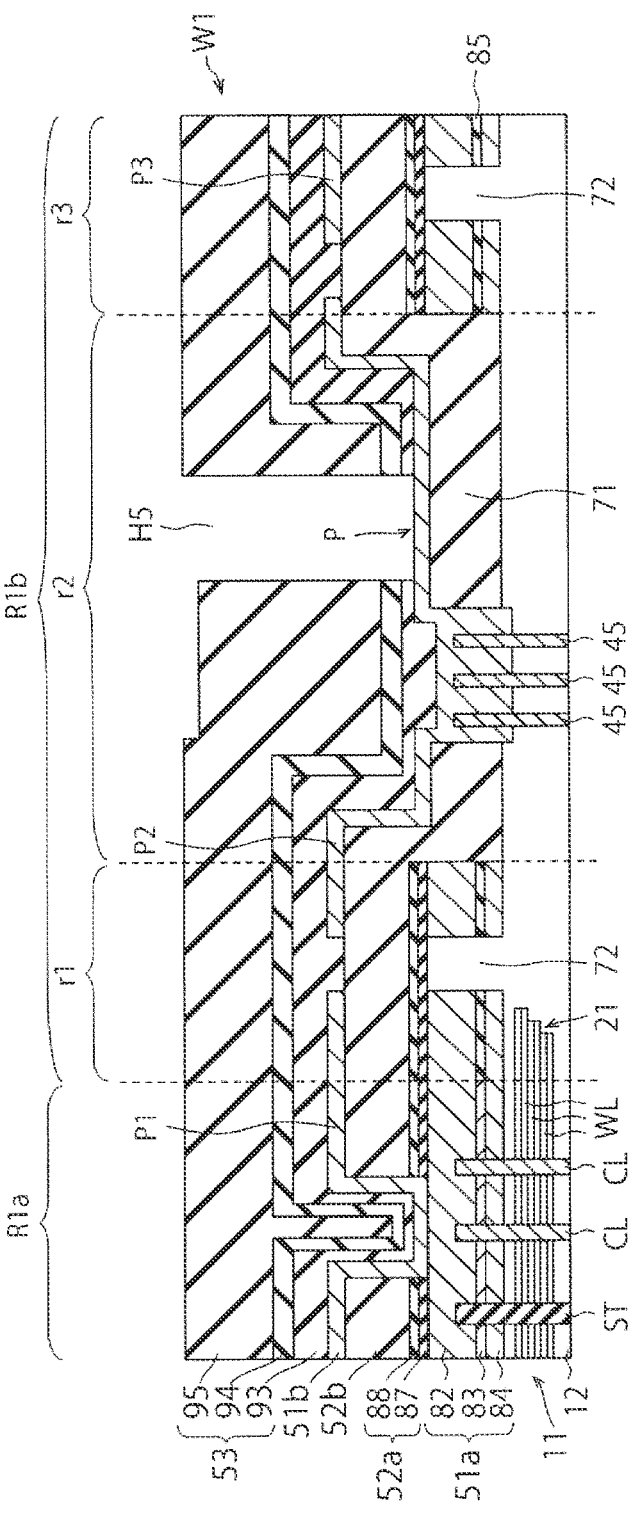
FIG. 34 is a cross-sectional view illustrating the semiconductor device of the second embodiment, during one of various fabrication stages of an example method (14/14).

Next, insulating films 93, 94, and 95 are formed in order on the metal layer 51b and the like, and the opening H5 that extends through the insulating films 95, 94, and 93 is formed (FIG. 34). As a result, the insulating passivation film 53 including the insulating films 95, 94, and 93 is formed on the metal layer 51b. For example, the insulating film 93 is a $SiO_2$ film. For example, the insulating film 94 is a SiN film. For example, the insulating film 95 is a polyimide film. Furthermore, a part of the upper surface of the portion P2 is exposed in the opening H5. The opening H5 corresponds to the aforementioned opening P. A region of the portion P2 exposed in the opening H5 is used as a bonding pad. In FIG. 34, a part of the portion P2 is disposed in the recess portion 71, and the portion P2 at the pad region r2 is disposed on the interlayer insulating film 12 and the like without the semiconductor layer 51a interposed between the portion P2 and the interlayer insulating film 12.

Subsequently, the array wafer W1 and the circuit wafer W2 are cut into a plurality of chips. Thus, the semiconductor device of the embodiment is manufactured.

As described above, the semiconductor layer 51a of the embodiment is processed so that the semiconductor layer 51a includes the recess portions 71, 72, and 73. According to the embodiment, the problems caused by the semiconductor layer 51a, for example, the problems about peeling of a layer and a film in the array wafer W1 and the circuit wafer W2 can be reduced.

Third Embodiment

Figure 35:
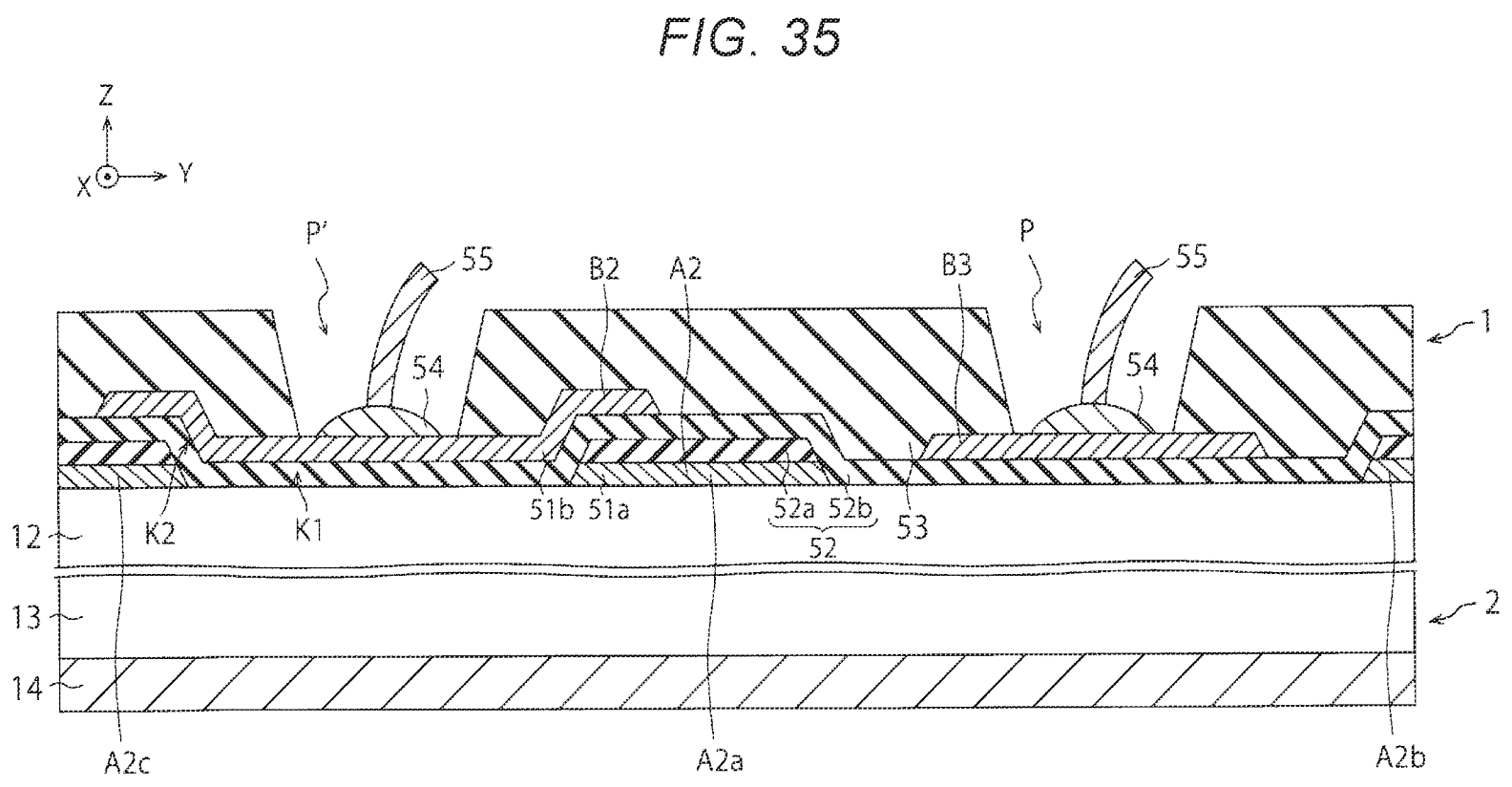

FIG. 35 is a cross-sectional view illustrating a structure of a semiconductor device of a third embodiment.

The semiconductor device (FIG. 35) of the embodiment includes the array chip 1 and the circuit chip 2 as in the semiconductor device (FIG. 1) of the first embodiment. However, FIG. 35 omits illustration of various elements on the substrate 14 and in the interlayer insulating films 12 and 13. The substrate 14 is an example of a first substrate. The interlayer insulating films 12 and 13 are examples of the first insulating film.

As illustrated in FIG. 35, the array chip 1 of the embodiment includes the semiconductor layer 51a, the metal layer 51b, the insulating film 52a, the insulating film 52b, the passivation insulating film 53, a plurality of solder layers 54, and a plurality of bonding wires 55. FIG. 35 further illustrates the insulating film 52 including the insulating film 52a and the insulating film 52b. The insulating film 52 is an example of a second insulating film.

The semiconductor layer 51a is formed on the interlayer insulating film 12. The semiconductor layer 51a of the embodiment, similar to the semiconductor layer 51a of the first embodiment, includes the portions A1 and A2 (FIG. 1) separated from each other. FIG. 35 illustrates only the portion A2 of the portions A1 and A2. FIG. 35 further illustrates three portions A2a, A2b, A2c included in the portion A2. These three portions A2a, A2b, and A2c are connected to each other in a cross section different from a cross section illustrated in FIG. 35 (see FIG. 37).

The insulating film 52a is formed on the semiconductor layer 51a. For example, the insulating film 52a is a SiO$_2$ film.

The insulating film 52b is formed on the insulating film 52a, the semiconductor layer 51a, and the interlayer insulating film 12. For example, the insulating film 52b is a SiO$_2$ film.

The metal layer 51b is formed on the insulating film 52b. The metal layer 51b is further formed on the semiconductor layer 51a and the plurality of via plugs 45 in a cross section different from the cross section illustrated in FIG. 35 (see FIG. 37). The metal layer 51b of the embodiment, similar to the metal layer 51b of the first embodiment, includes the portions B1, B2 and B3 (FIG. 1) separated from one other. FIG. 35 illustrates only the portions B2 and B3 of the portions B1, B2 and B3. The portion B1 is an example of the first portion. The portions B2 and B3 are examples of the second portion.

The insulating passivation film 53 is formed on the metal layer 51b and the insulating film 52b, and covers a part of the metal layer 51b. The passivation insulating film 53 of the embodiment includes the opening P that exposes a part of the upper surface of the portion B3 and an opening P' that exposes a part of the upper surface of the portion B2.

The region of the portion B3 exposed to the opening P functions as the external connection pad (bonding pad) of the semiconductor device of the embodiment, and for example, functions as the input/output (I/O) pad for input/output of a signal. The portion B3 can be connected to a mounting substrate or another device via the bonding wire, a solder ball, a metal bump, or the like in the opening P. FIG. 35 illustrates the bonding wire 55 electrically connected to the portion B3 via the solder layer 54.

As illustrated in FIG. 35, the bonding pad of the portion B3 is formed on the interlayer insulating film 12 without the semiconductor layer 51a interposed between the bonding pad and the interlayer insulating film 12. Specifically, the entire portion B3 of the embodiment is formed on the interlayer insulating film 12 without the semiconductor layer 51a interposed between the portion B3 and the interlayer insulating film 12, and as a result, the bonding pad of the portion B3 (the portion of the opening P) is formed on the interlayer insulating film 12 without the semiconductor layer 51a interposed between the bonding pad and the interlayer insulating film 12. As a result, it is possible to reduce the influence of the parasitic capacitance on a signal passing through the bonding pad. This bonding pad is an example of a first bonding pad. The portion B3 is an example of a fifth portion.

A region of the portion B2 exposed to the opening P' functions as the external connection pad (bonding pad) of the semiconductor device of the embodiment, and for example, functions as a power supply pad for supplying a power supply voltage (for example, VDD voltage or GND voltage). The portion B2 can be connected to the mounting substrate or another device via the bonding wire, the solder ball, the metal bump, or the like in the opening P'. FIG. 35 illustrates the bonding wire 55 electrically connected to the portion B2 via the solder layer 54.

As illustrated in FIG. 35, the bonding pad of the portion B2 is also formed on the interlayer insulating film 12 without the semiconductor layer 51a interposed between the bonding pad and the interlayer insulating film 12. Specifically, the portion B2 of the embodiment includes a portion formed on the interlayer insulating film 12 via the semiconductor layer 51a and a portion formed on the interlayer insulating film 12 without the semiconductor layer 51a interposed between the portion B2 and the interlayer insulating film 12, and the bonding pad of the portion B2 (the portion of the opening P') is formed on the interlayer insulating film 12 without the semiconductor layer 51a interposed between the bonding pad and the interlayer insulating film 12. As a result, it is possible to reduce the influence of the parasitic capacitance on a power supply voltage passing through the bonding pad. This bonding pad is an example of a second bonding pad. The portion B2 is an example of a sixth portion.

Here, the insulating film 52b of the embodiment will be described.

The insulating film 52b of the embodiment includes a portion directly formed on the interlayer insulating film 12 and a portion formed on the interlayer insulating film 12 via the semiconductor layer 51a and the insulating film 52a, and there is a step at a boundary of these portions. In the vicinity of the step, end faces of the semiconductor layer 51a and the insulating film 52a are tapered surfaces.

Therefore, an upper surface of the insulating film 52b of the embodiment includes an upper surface K1 that is substantially perpendicular to the Z direction and an upper surface K2 that is inclined with respect to the upper surface K1. The upper surface K2 is located near the above step, and the upper surface K1 is located at another location. The upper surface K1 of the embodiment may be exactly perpendicular to the Z direction, or may be slightly inclined with respect to the Z direction. On the other hand, the upper surface K1 of the embodiment is greatly inclined with respect to the Z direction. The upper surface K1 is an example of a first upper surface. The upper surface K2 is an example of a second upper surface.

The portion B2 of the embodiment includes a portion formed on the upper surface K1 of the insulating film 52b and a portion formed on the upper surface K2 of the insulating film 52b. As a result, the portion B2 of the embodiment includes the portion formed on the interlayer insulating film 12 without the semiconductor layer 51a interposed between the portion B2 and the interlayer insulating film 12 and the portion formed on the interlayer insulating film 12 via the semiconductor layer 51a.

On the other hand, the portion B3 of the embodiment includes the portion formed on the upper surface K1 of the insulating film 52b, but does not include the portion formed on the upper surface K2 of the insulating film 52b. As a result, the portion B3 of the embodiment includes the portion formed on the interlayer insulating film 12 without the semiconductor layer 51a interposed between the portion B3 and the interlayer insulating film 12, but does not include the portion formed on the interlayer insulating film 12 via the semiconductor layer 51*a*. That is, the entire portion B3 of the embodiment is formed on the interlayer insulating film 12 without the semiconductor layer 51*a* interposed between the portion B3 and the interlayer insulating film 12. However, a part of the portion B3 or the entire portion B3 of the embodiment may be formed on the interlayer insulating film 12 via the semiconductor layer 51*a*.

Details of the upper surfaces K1 and K2 of the insulating film 52*b* will be described below.

Figure 36:
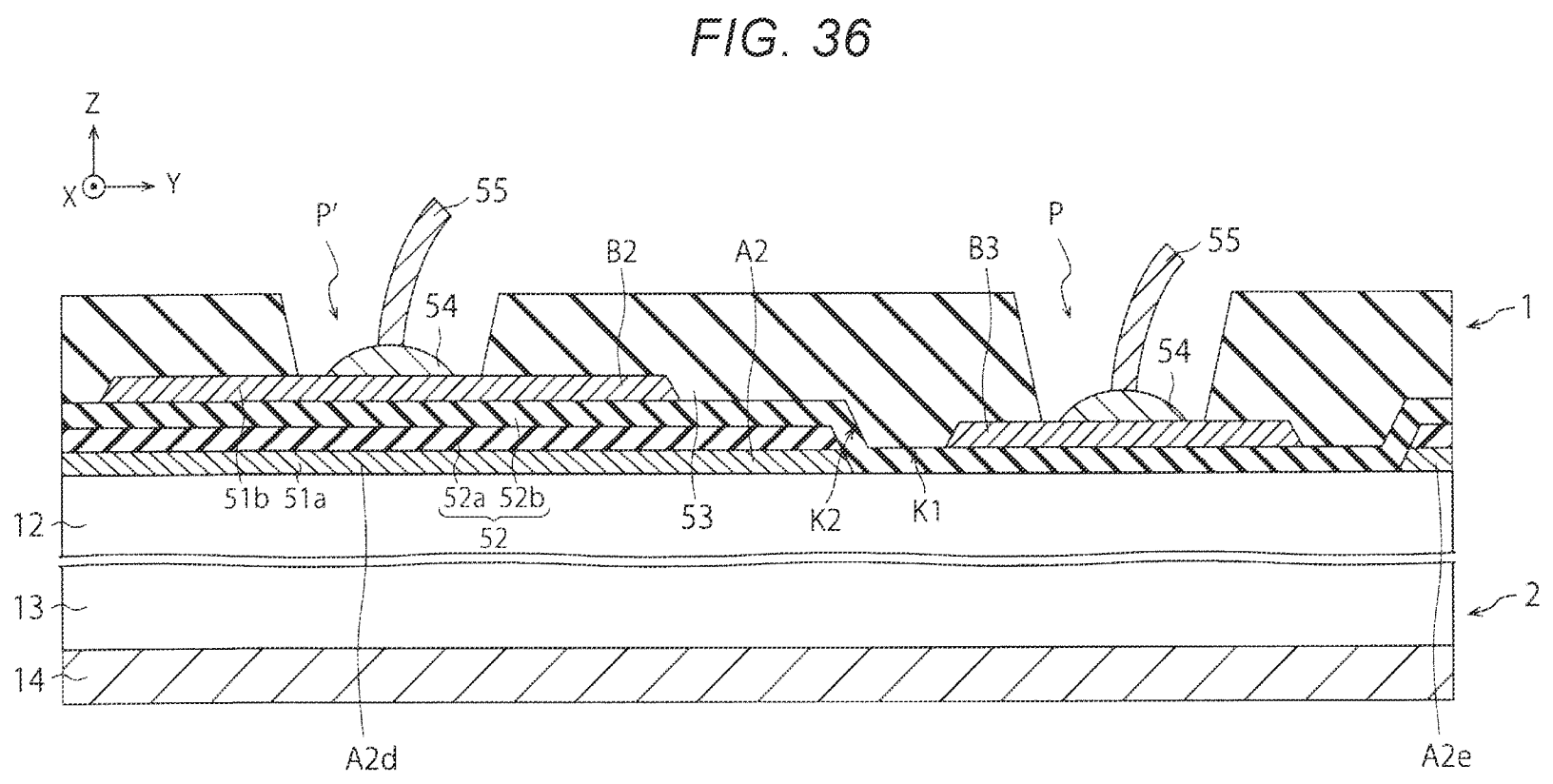

FIG. 36 is a cross-sectional view illustrating a structure of a semiconductor device of Comparative Example of the third embodiment.

The semiconductor device of Comparative Example (FIG. 36) includes the same elements as those of the semiconductor device of the third embodiment (FIG. 35). However, the portion A2 of Comparative Example includes portions A2*d* and A2*e* connected to each other instead of the portions A2*a*, A2*b* and A2*c* connected to one other. Further, the bonding pad (portion of the opening P') of the portion B2 of Comparative Example is formed on the interlayer insulating film 12 via the semiconductor layer 51*a* (portion A2*d*). Therefore, a parasitic capacitance is formed between the portions A2*d* and B2, to affect the power supply voltage passing through the bonding pad of the portion B2.

On the other hand, as illustrated in FIG. 35, the bonding pad (portion of the opening P') of the portion B2 of the embodiment is formed on the interlayer insulating film 12 without the semiconductor layer 51*a* interposed between the bonding pad and the interlayer insulating film 12. Therefore, according to the embodiment, it is possible to reduce the influence of the parasitic capacitance on the power supply voltage passing through the bonding pad of the portion B2. This effect also applies to the bonding pad (portion of the opening P) of the portion B3 of the embodiment. According to the embodiment, it is also possible to reduce the influence of the parasitic capacitance on the signal passing through the bonding pad of the portion B3.

Next, referring again to FIG. 35, the portions B2 and B3 of the embodiment will be described.

As described above, the bonding pad of the portion B2 of the embodiment is, for example, the power supply pad for supplying a power supply voltage. In this case, generally, the portion B2 serving as the power supply line needs to be disposed in a wide area on the interlayer insulating film 12. Therefore, it is difficult to form the entire portion B2 on the interlayer insulating film 12 without the semiconductor layer 51*a* interposed between the portion B2 and the interlayer insulating film 12, and it is necessary to form a part of the portion B2 on the interlayer insulating film 12 via the semiconductor layer 51*a*. Therefore, the portion B2 of the embodiment includes the portion formed on the interlayer insulating film 12 without the semiconductor layer 51*a* interposed between the portion B2 and the interlayer insulating film 12 and the portion formed on the interlayer insulating film 12 via the semiconductor layer 51*a*.

As a result, the portion B2 of the embodiment includes the portion formed on the upper surface K1 of the insulating film 52*b* and the portion formed on the upper surface K2 of the insulating film 52*b*. In this case, since the upper surface K2 is inclined, it is difficult to properly form the portion B2 on the upper surface K2, which is a problem. For example, an extra metal material for forming the metal layer 51*b* may remain on the upper surface K2, which may cause a short circuit in the portion B2. In the embodiment, this problem is dealt with by a method described below with reference to FIG. 39.

On the other hand, the bonding pad of the portion B3 of the embodiment is, for example, the I/O pad for input/output of a signal. In this case, generally, the portion B3 serving as a signal line does not need to be disposed in a wide area on the interlayer insulating film 12. Therefore, it is easy to form the entire portion B3 on the interlayer insulating film 12 without the semiconductor layer 51*a* interposed between the portion B3 and the interlayer insulating film 12. Therefore, the portion B3 of the embodiment includes the portion formed on the interlayer insulating film 12 without the semiconductor layer 51*a* interposed between the portion B3 and the interlayer insulating film 12, but does not include the portion formed on the interlayer insulating film 12 via the semiconductor layer 51*a*.

As a result, the portion B3 of the embodiment includes the portion formed on the upper surface K1 of the insulating film 52*b*, but does not include the portion formed on the upper surface K2 of the insulating film 52*b*. As a result, for the portion B3, it is possible to avoid the above short circuit problem.

Figure 37:
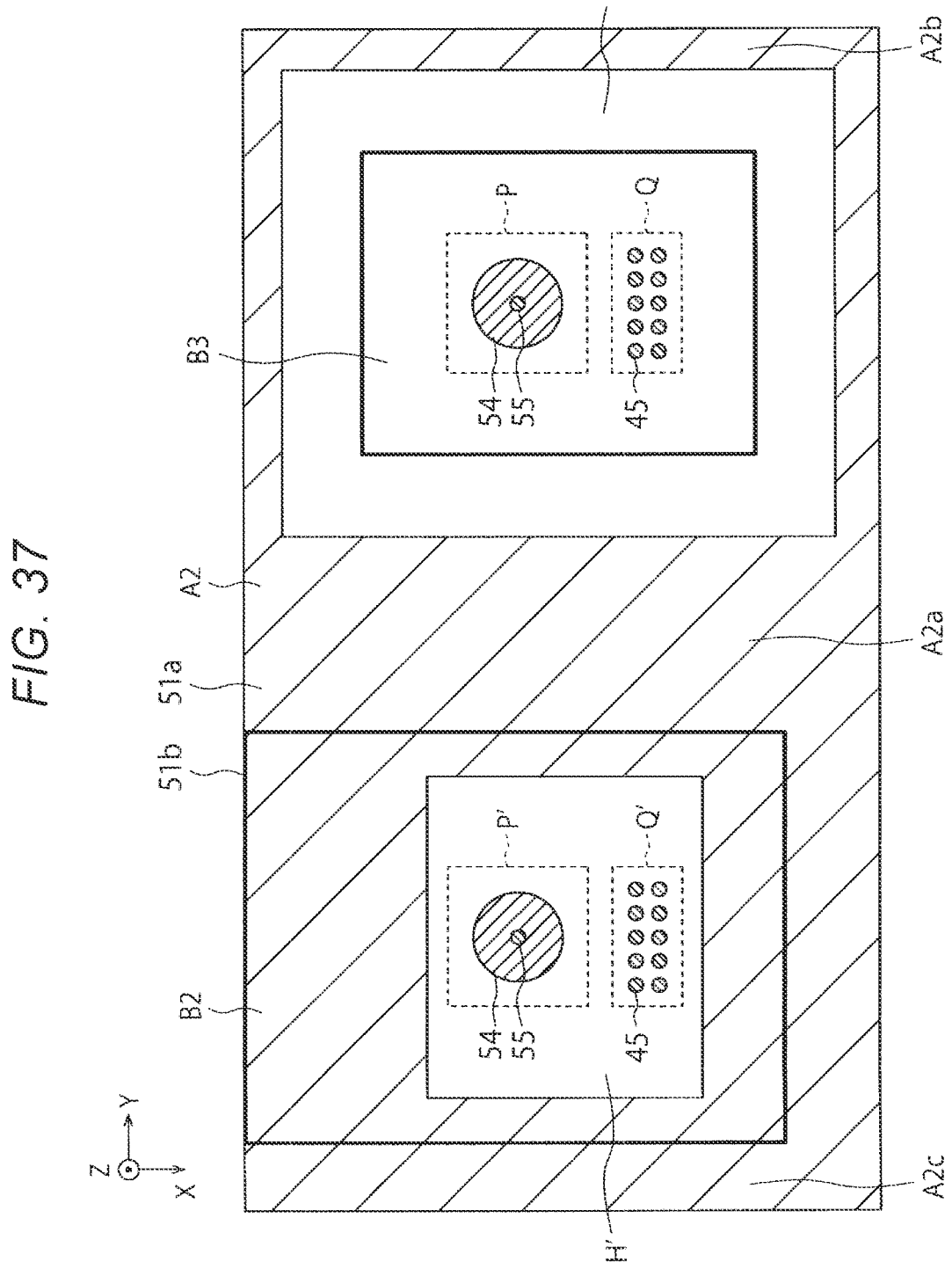
FIG. 37 is a plan view illustrating the structure of the semiconductor device of the third embodiment.

FIG. 37 is a plan view illustrating the structure of the semiconductor device of the third embodiment.

In FIG. 37, a shape of the semiconductor layer 51*a* is represented by diagonal hatching, and a shape of the metal layer 51*b* is represented by thick lines. In FIG. 37, the portion A2 of the semiconductor layer 51*a* includes the portions A2*a*, A2*b*, A2*c* connected to one other, and the metal layer 51*b* includes the portions B2, B3 separated from each other.

FIG. 37 further illustrates openings H and H' disposed in the semiconductor layer 51*a*. In these openings H and H', the insulating film 52*b* is directly formed on the interlayer insulating film 12 (see FIG. 35). The opening H is disposed between the portion A2*a* and the portion A2*b*. The opening H' is disposed between the portion A2*a* and the portion A2*c*.

In FIG. 37, the opening H of the semiconductor layer 51*a* surrounds the portion B3 of the metal layer 51*b*. That is, the portion B3 includes the portion formed on the interlayer insulating film 12 without the semiconductor layer 51*a* interposed between the portion B3 and the interlayer insulating film 12, but does not include the portion formed on the interlayer insulating film 12 via the semiconductor layer 51*a*.

Further, in FIG. 37, the portion B2 of the metal layer 51*b* surrounds the opening H' of the semiconductor layer 51*a*. That is, the portion B2 includes the portion formed on the interlayer insulating film 12 without the semiconductor layer 51*a* interposed between the portion B2 and the interlayer insulating film 12 and the portion formed on the interlayer insulating film 12 via the semiconductor layer 51*a*.

FIG. 37 further illustrates the opening P for the portion B3, the opening P' for the portion B2, a region Q in which the plurality of via plugs 45 electrically connected to the portion B3 are disposed, and a region Q' in which the plurality of via plugs 45 electrically connected to the portion B2 are disposed. In the plan view illustrated in FIG. 37, the regions Q and Q' are disposed in the X direction of the openings P and P', respectively. Further, the openings P and P' are disposed in the openings H and H', respectively.

Figure 38:
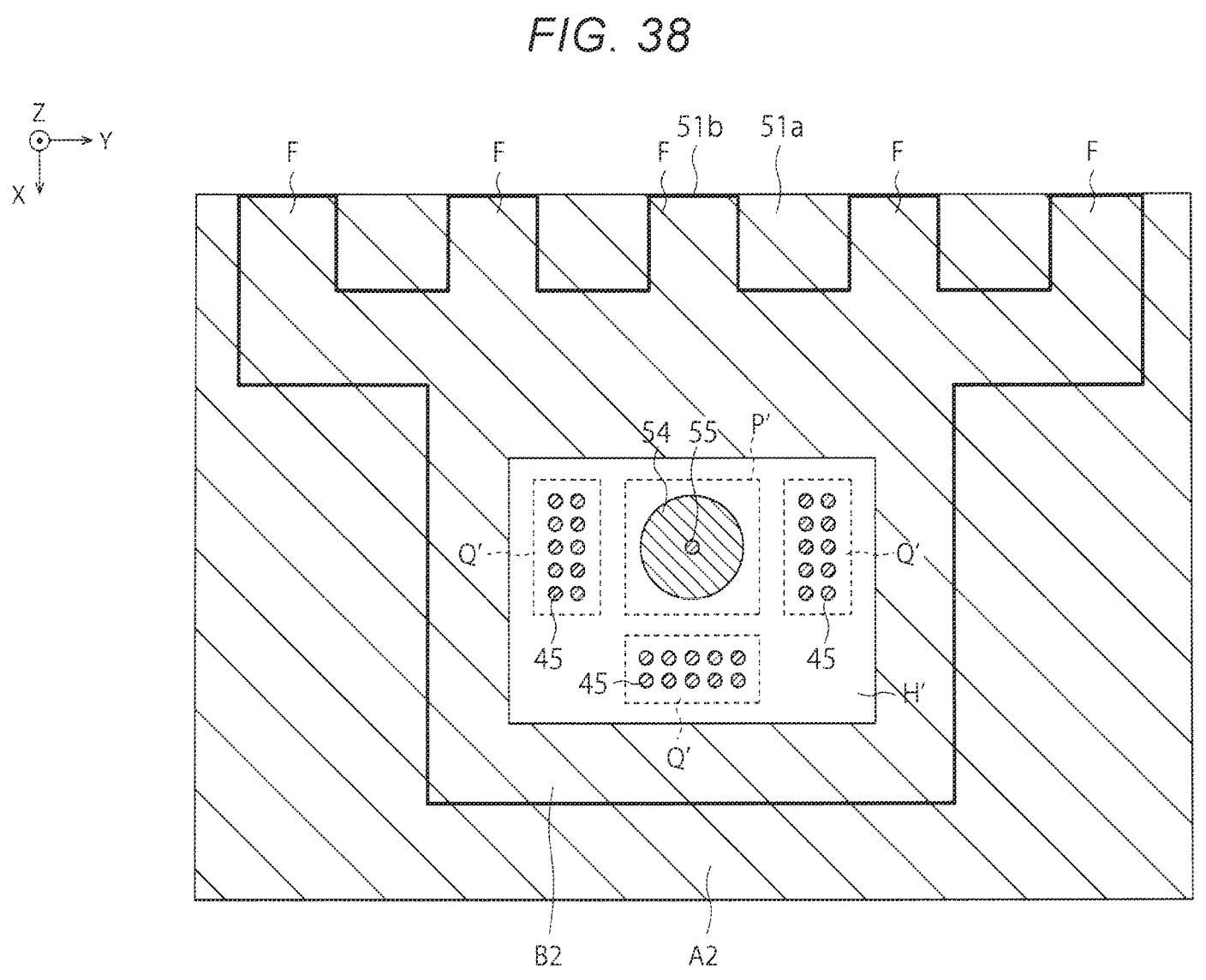

FIG. 38 is a plan view illustrating a structure of a semiconductor device of Modified Example of the third embodiment.

FIG. 38 illustrates the portion A2 of the semiconductor layer 51*a* and the portion B2 of the metal layer 51*b*. As illustrated in FIG. 38, the portion B2 may include a plurality of branch portions F. Further, the portion B2 may include a plurality of regions Q'. These regions Q' may be disposed in any direction of the opening P'. In FIG. 38, these regions Q' are disposed in a +X direction, a +Y direction, and a –Y direction of the opening P'.

Figure 39A:
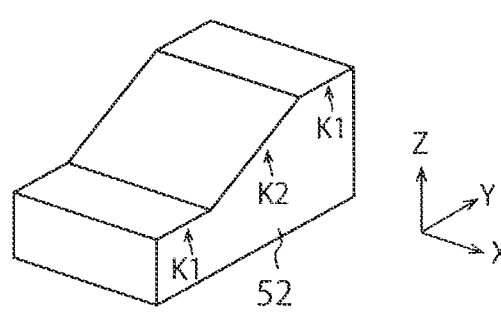
FIGS. 39A, 39B and 39C are perspective views illustrating the structure of the semiconductor device of the third embodiment.
Figure 39B:
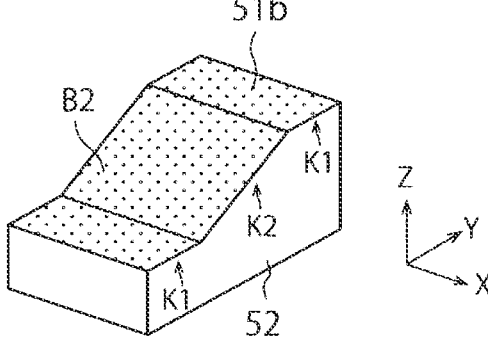
Figure 39C:
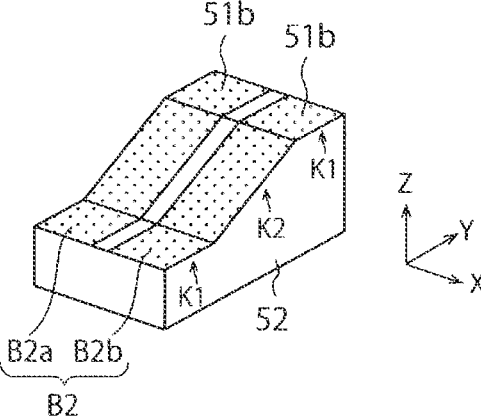

FIGS. 39A, 39B and 39C are perspective views illustrating the structure of the semiconductor device of the third embodiment.

FIG. 39A illustrates two upper surfaces K1 and one upper surface K2 of the insulating film 52. The upper surface K2 is inclined with respect to the upper surfaces K1.

In FIG. 39B, the portions B2 formed on these upper surfaces K1 and K2 is represented by dot hatching for easy viewing. The portion B2 illustrated in FIG. 39B is formed on the upper surface K2 so as to cover an entire surface of the upper surface K2.

In FIG. 39C as well, the portions B2 formed on these upper surfaces K1 and K2 is represented by dot hatching for easy viewing. The portion B2 illustrated in FIG. 39C is formed on the upper surface K2 so as not to cover the entire surface of the upper surface K2. The portion B2 illustrated in FIG. 39C includes a portion B2*a* and a portion B2*b*, and does not cover the upper surface K2 in a region between the portion B2*a* and the portion B2*b*.

Here, the portion B2 illustrated in FIG. 39B is compared with the portion B2 illustrated in FIG. 39C.

When the portion B2 is formed on the surface K2, since the upper surface K2 is inclined, it is difficult to properly form the portion B2 on the upper surface K2, which is a problem. For example, an extra metal material for forming the metal layer 51*b* may remain on the upper surface K2, which may cause a short circuit in the portion B2. In FIG. 39C, when the extra metal material remains in the region between the portion B2*a* and the portion B2*b*, the portion B2*a* and the portion B2*b* are short-circuited.

Therefore, when the portion B2 is formed on the upper surface K2, it is desirable not to adopt the structure illustrated in FIG. 39C but to adopt the structure illustrated in FIG. 39B. That is, when the portion B2 is formed on the upper surface K2, it is desirable that the portion B2 is formed on the upper surface K2 so as to cover the entire surface of the upper surface K2. As a result, it is possible to reduce the occurrence of the above short circuit.

For example, when the insulating film 52 of the embodiment has N upper surfaces K2, it is desirable that each upper surface K2 is either not covered by the portion B2 at all as illustrated in FIG. 39A or completely covered by the portion B2 as illustrated in FIG. 39B. That is, it is desirable not to provide the upper surface K2 partially covered by the portion B2 as illustrated in FIG. 39C.

Specifically, the opening H' of the semiconductor layer 51*a* illustrated in FIG. 37 has a rectangular plane shape. Therefore, the portion B2 illustrated in FIG. 37 is formed on the four upper surfaces K2 near four sides of the rectangular opening H'. In this case, it is desirable that the portion B2 illustrated in FIG. 37 is formed on these four upper surfaces K2 so as to cover the entire surface of these four upper surfaces K2.

As described above, the bonding pad of the portion B2 or B3 of the metal layer 51*b* of the embodiment is disposed on the interlayer insulating film 12 without the semiconductor layer 51*a* interposed between the bonding pad and the interlayer insulating film 12. Therefore, according to the embodiment, the above problems caused by the semiconductor layer 51*a* can be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first substrate;
a first insulating film disposed on the first substrate;
a memory cell array disposed in the first insulating film and including a first region and a second region, the first region including a plurality of electrodes and a columnar portion penetrating the plurality of electrodes, the second region including a stair structure and a contact plug;
a semiconductor layer including a first semiconductor layer and a second semiconductor layer, the first semiconductor layer disposed above the plurality of electrodes, the columnar portion electrically connected to the first semiconductor layer, the second semiconductor layer disposed above the stair structure;
a metal layer including a first portion and a second portion, wherein a part of the first portion is connected to the first semiconductor layer, and the second portion includes a bonding pad and is disposed on the first insulating film without the semiconductor layer interposed between the second portion and the first insulating film; and
a second insulating film disposed between the first semiconductor layer and the second semiconductor layer.

2. The semiconductor device according to claim 1, wherein the second portion is separated from the first portion.

3. The semiconductor device according to claim 1, wherein the first substrate contains a plurality of third regions, and a fourth region disposed between adjacent ones of the third regions, the fourth region configured to be diced, and
the first semiconductor layer is disposed on the first insulating film only above the first regions.

4. The semiconductor device according to claim 1, further comprising:
a transistor disposed on the first substrate;
a first pad disposed in the first insulating film and electrically connected to the transistor; and
a second pad disposed on the first pad in the first insulating film and electrically connected to the bonding pad.

5. The semiconductor device according to claim 1, wherein the semiconductor layer includes a recess portion disposed in the semiconductor layer.

6. The semiconductor device according to claim 5, wherein the recess portion extends through the semiconductor layer.

7. The semiconductor device according to claim 5, wherein the bonding pad is disposed in the recess portion when viewed from the top.

8. The semiconductor device according to claim 5, wherein at least a part of the second portion is disposed in the recess portion.

9. The semiconductor device according to claim 5, wherein a part of the first insulating film is disposed in the recess portion.

10. The semiconductor device according to claim 5, wherein a width of the recess portion is equal to or less than 500 nm.

11. The semiconductor device according to claim 5, wherein a proportion of an area of the recess portion in collective areas of the semiconductor layer and the recess portion is in a range of 10% to 15%.

12. The semiconductor device according to claim 1, wherein the second portion includes: a first bonding pad disposed on the first insulating film without the semiconductor layer interposed between the first bonding pad and the first insulating film, and a second bonding pad disposed on the first insulating film with the semiconductor layer disposed below the first insulating film.

13. The semiconductor device according to claim 12, wherein the first bonding pad is an input/output (I/O) pad for input/output of a signal, and the second bonding pad is a power supply pad for supplying a power supply voltage.

14. The semiconductor device according to claim 12, wherein the second bonding pad is separated from the first bonding pad.

15. The semiconductor device according to claim 12, wherein the first bonding pad does not include a portion disposed on the first insulating film via the semiconductor layer, and the second bonding pad includes a portion disposed on the semiconductor layer via the first insulating film.

16. The semiconductor device according to claim 12, wherein the second insulating film is disposed on the first insulating film, wherein an upper surface of the second insulating film includes a first upper surface, and a second upper surface inclined with respect to the first upper surface, and wherein the second bonding pad includes a portion disposed on the second upper surface of the second insulating film.

17. The semiconductor device according to claim 16, wherein the second bonding pad is disposed on the second upper surface to cover an entire surface of the second upper surface.

18. The semiconductor device according to claim 16, wherein the first bonding pad does not include the portion disposed on the second upper surface of the second insulating film.

19. The semiconductor device according to claim 1, wherein the part of the first portion extends in a first direction perpendicular to a surface of the first substrate, and is directly connected to the semiconductor layer.

* * * * *